(12) United States Patent　　(10) Patent No.:　US 12,641,863 B2

Chen　　(45) Date of Patent:　May 26, 2026

(54) SEMICONDUCTOR TRANSISTOR STRUCTURE INCLUDING PROTECTION LAYERS OVER ISOLATION STRUCTURE AND METHOD FOR FORMING THE SAME

(71) Applicant: Taiwan Semiconductor Manufacturing Company, Ltd., Hsinchu (TW)

(72) Inventor: Chih-Yang Chen, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 474 days.

(21) Appl. No.: 18/312,258

(22) Filed: May 4, 2023

(65) Prior Publication Data

US 2024/0371864 A1　　Nov. 7, 2024

(51) Int. Cl.
| | |
|---|---|
| *H10D 84/01* | (2026.01) |
| *H10D 30/67* | (2025.01) |
| *H10D 64/01* | (2025.01) |
| *H10D 84/03* | (2025.01) |

(52) U.S. Cl.
CPC ..... *H10D 84/0151* (2025.01); *H10D 30/6735* (2025.01); *H10D 64/017* (2025.01); *H10D 84/038* (2025.01)

(58) Field of Classification Search
CPC ........... H10D 30/6735; H10D 84/0151; H10D 64/017; H10D 84/038; H10D 30/797; H10D 84/83
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2020/0083219 | A1* | 3/2020 | Kang ................... B82Y 10/00 |

* cited by examiner

*Primary Examiner* — Changhyun Yi

(74) *Attorney, Agent, or Firm* — Birch, Stewart, Kolasch & Birch, LLP

(57)　　ABSTRACT

A method for forming a semiconductor structure is provided. The method includes forming active regions over a substrate, forming an isolation structure to surround lower portions of the active regions, forming dummy gate structures across the active regions and the isolation structure, forming a spacer layer along the dummy gate structures, the active regions and the isolation structure to partially fill a space defined by the active regions and the dummy gate structures, forming a sacrificial material over the spacer layer to overfill a remainder of the space, recessing the sacrificial material to expose the spacer layer, etching the spacer layer to expose the active region, etching the active region to form a recess, and forming a source/drain feature in the source/drain recess.

20 Claims, 28 Drawing Sheets

SEMICONDUCTOR TRANSISTOR STRUCTURE INCLUDING PROTECTION LAYERS OVER ISOLATION STRUCTURE AND METHOD FOR FORMING THE SAME

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with conventional complementary metal-oxide-semiconductor (CMOS) processes, and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2B-1, 2C-1, 2D-1, 2E-1, 2F-1, 2G-1, 2H-1, 2I-1, 2J-1, 2K-1 and 2L-1 are cross-sectional views illustrating the formation of a semiconductor structure at various intermediate stages, in accordance with some embodiments of the disclosure.

FIGS. 2A-2, 2B-2, 2C-2, 2D-2, 2E-2, 2F-2, 2G-2, 2H-2, 2I-2, 2J-2, 2K-2 and 2L-2 are cross-sectional views illustrating the formation of a semiconductor structure at various intermediate stages, in accordance with some embodiments of the disclosure.

FIGS. 2A-3, 2B-3, 2C-3, 2D-3, 2E-3, 2F-3, 2G-3, 2H-3, 2I-3, 2J-3, 2K-3 and 2L-3 are cross-sectional views illustrating the formation of a semiconductor structure at various intermediate stages, in accordance with some embodiments of the disclosure.

FIGS. 2B-4, 2D-4, 2H-4, 2L-4 are plan views illustrating the formation of a semiconductor structure at various intermediate stages, in accordance with some embodiments of the disclosure.

FIGS. 2H-5 and 2L-5 are plan views illustrating the formation of a semiconductor structure at various intermediate stages, in accordance with some embodiments of the disclosure.

FIGS. 3A-1 and 3B-1 are cross-sectional views illustrating the formation of a semiconductor structure at various intermediate stages, in accordance with some embodiments of the disclosure.

FIGS. 3A-2 and 3B-2 are cross-sectional views illustrating the formation of a semiconductor structure at various intermediate stages, in accordance with some embodiments of the disclosure.

FIGS. 3A-3 and 3B-3 are cross-sectional views illustrating the formation of a semiconductor structure at various intermediate stages, in accordance with some embodiments of the disclosure.

FIG. 3B-4 is a plan view illustrating the formation of a semiconductor structure at an intermediate stage, in accordance with some embodiments of the disclosure.

FIG. 3B-5 is a plan view illustrating the formation of a semiconductor structure at an intermediate stage, in accordance with some embodiments of the disclosure.

FIGS. 4A-1 and 4B-1 are cross-sectional views illustrating the formation of a semiconductor structure at various intermediate stages, in accordance with some embodiments of the disclosure.

FIGS. 4A-2 and 4B-2 are cross-sectional views illustrating the formation of a semiconductor structure at various intermediate stages, in accordance with some embodiments of the disclosure.

FIGS. 4A-3 and 4B-3 are cross-sectional views illustrating the formation of a semiconductor structure at various intermediate stages, in accordance with some embodiments of the disclosure.

FIG. 4B-4 is a plan view illustrating the formation of a semiconductor structure at an intermediate stage, in accordance with some embodiments of the disclosure.

FIG. 4B-5 is a plan view illustrating the formation of a semiconductor structure at an intermediate stage, in accordance with some embodiments of the disclosure.

FIGS. 5-1 to 5-3 are a modification of the semiconductor structure of FIGS. 4B-1 to 4B-3, in accordance with some embodiments of the disclosure.

FIGS. 6A-1, 6B-1 and 6C-1 are cross-sectional views illustrating the formation of a semiconductor structure at various intermediate stages, in accordance with some embodiments of the disclosure.

FIGS. 6A-2, 6B-2 and 6C-2 are cross-sectional views illustrating the formation of a semiconductor structure at various intermediate stages, in accordance with some embodiments of the disclosure.

FIGS. 6A-3, 6B-3 and 6C-3 are cross-sectional views illustrating the formation of a semiconductor structure at various intermediate stages, in accordance with some embodiments of the disclosure.

FIGS. 7-1 to 7-3 are a modification of the semiconductor structure of FIGS. 2L-1 to 2L-3, in accordance with some embodiments of the disclosure.

DETAILED DESCRIPTION

Figure 1:
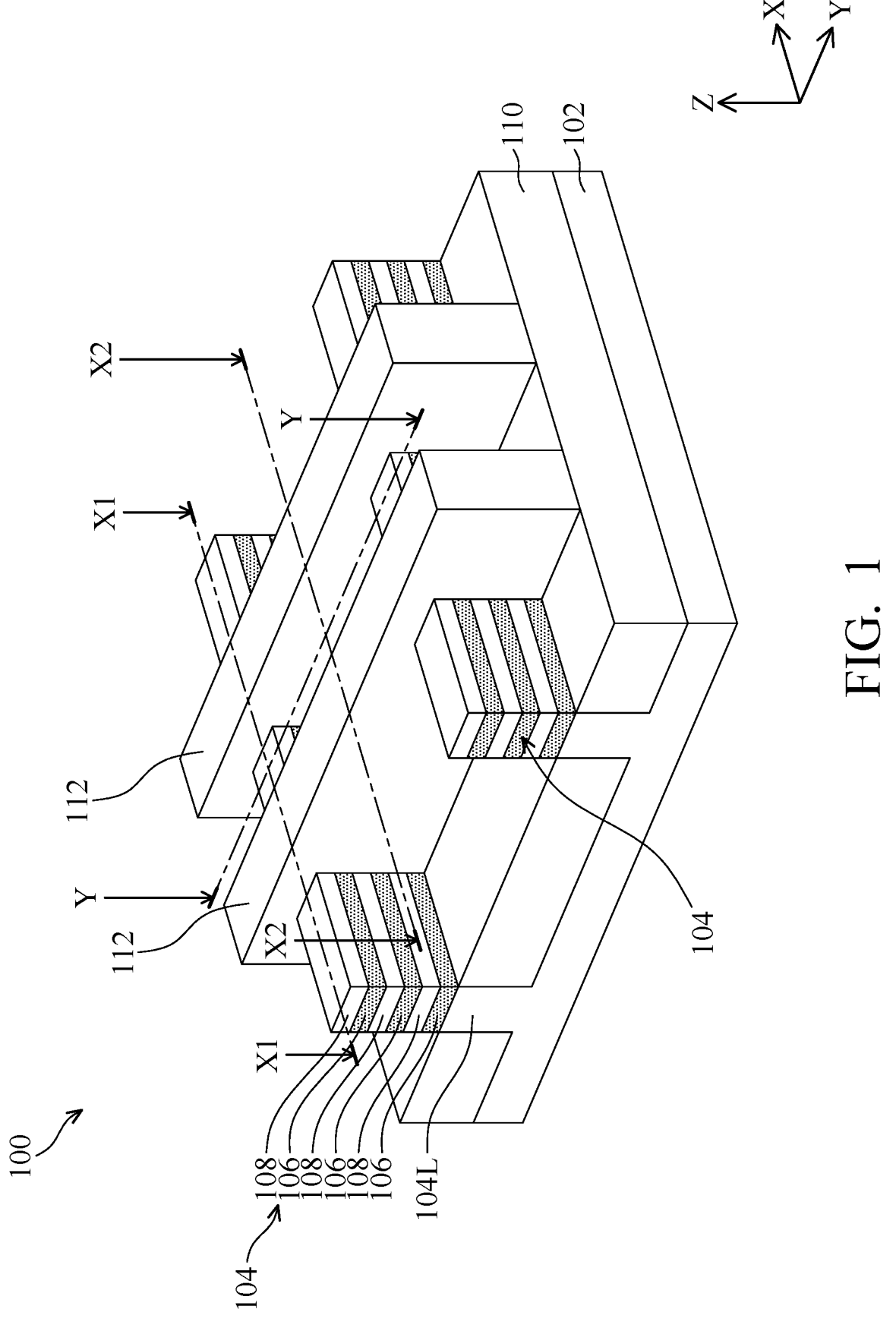
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The nanostructure transistor (e.g., nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor structure and a method for forming the semiconductor structure are provided. The method includes forming a sacrificial material and protection layers over an isolation structure, thereby preventing the isolation structure from being seriously recessed in several etching processes, especially in the etching processes for forming the gate spacers and fin spacers and for forming the source/drain recesses. As a result, the risk that the dummy gate structures collapse may decrease. Furthermore, the risk of exposing the lower fin elements of the active regions may decrease, and thus preventing the merging of the source/drain features. Therefore, the reliability, the manufacturing yield and performance of the resulting semiconductor structure may increase.

FIG. 1 is a perspective view of a semiconductor structure 100, in accordance with some embodiments. A semiconductor structure 100 is provided, as shown in FIG. 1, in accordance with some embodiments. The semiconductor structure 100 includes a substrate 102 and fin structures 104 and an isolation structure 110 over the substrate 102, in accordance with some embodiments. For a better understanding of the semiconductor structure, X-Y-Z coordinate reference is provided in the figures of the present disclosure. The X-axis and the Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

Each of the fin structures 104 includes a lower fin element 104L surrounded by the isolation structure 110 and an upper fin element formed from an epitaxial stack including alternating first semiconductor layers 106 and second semiconductor layer 108, in accordance with some embodiments. The second semiconductor layers 108 will form nanostructures (e.g., nanowires or nanosheets) and serve as the channel for the resulting semiconductor devices, in accordance with some embodiments.

The fin structures 104 extend in the X direction, in accordance with some embodiments. That is, the fin structures 104 have longitudinal axes parallel to the X direction, in accordance with some embodiments. The X direction may also be referred to as the channel-extending direction. The current of the resulting semiconductor device (i.e., nanostructure transistor) flows in the X direction through the channel. Each of the fin structures 104 is defined as several channel regions and several source/drain regions, where the channel regions and the source/drain regions are alternately arranged, in accordance with some embodiments. In this disclosure, a source/drain refers to a source and/or a drain. It is noted that in the present disclosure, a source and a drain are interchangeably used and the structures thereof are substantially the same.

Gate structures 112 are formed with longitudinal axes parallel to the Y direction and extending across and/or surrounding the channel regions of the fin structures 104, in accordance with some embodiments. The source/drain regions of the fin structures 104 are exposed from the gate structures 112, in accordance with some embodiments. The Y direction may also be referred to as a gate-extending direction, in accordance with some embodiments.

FIG. 1 further illustrates a reference cross-section that is used in later figures. Cross-section X1-X1 is in a plan parallel to the longitudinal axis of the active regions 104 (i.e., X direction) and through the active regions 104, in accordance with some embodiments. Cross-section X2-X2 is in a plan parallel to the longitudinal axis of the active regions 104 (i.e., X direction) and through the isolation structure 110, in accordance with some embodiments. Cross-section Y-Y is in a plan parallel to the longitudinal axis of the gate structure (i.e., Y direction) and across the source/drain regions of the active regions 104, in accordance with some embodiments.

FIGS. 2A-1 through 2L-3 are cross-sectional views illustrating the formation of a semiconductor structure 100 at various intermediate stages, in which FIGS. 2A-1, 2B-1, 2C-1, 2D-1, 2E-1, 2F-1, 2G-1, 2H-1, 2I-1, 2J-1, 2K-1 and 2L-1 correspond to cross-section X1-X1 shown in FIG. 1, FIGS. 2A-2, 2B-2, 2C-2, 2D-2, 2E-2, 2F-2, 2G-2, 2H-2, 2I-2, 2J-2, 2K-2 and 2L-2 correspond to cross-section X2-X2 shown in FIG. 1, and FIGS. 2A-3, 2B-3, 2C-3, 2D-3, 2E-3, 2F-3, 2G-3, 2H-3, 2I-3, 2J-3, 2K-3 and 2L-3 correspond to cross-section Y-Y shown in FIG. 1, in accordance with some embodiments of the disclosure.

FIGS. 2A-1 to 2A-3 illustrate a semiconductor structure 100 after the formation of active regions 104, an isolation structure 110, a semiconductor capping layer 111 and dummy gate structures 112, in accordance with some embodiments.

A semiconductor structure 100 including a substrate 102, active regions 104, an isolation structure 110 and dummy gate structures 112 is provided, as shown in FIGS. 2A-1 to 2A-3, in accordance with some embodiments. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

In some embodiments, the active regions 104 extend in the X direction. The active regions 104 have longitudinal axes parallel to the X direction, in accordance with some embodiments. That is, the dimensions (lengths) of the active regions 104 in the X direction are greater than the dimensions (widths) of the active regions 104 in the Y direction.

The formation of the active regions 104 includes forming an epitaxial stack over the substrate 102 using an epitaxial growth process, in accordance with some embodiments. The epitaxial stack includes alternating first semiconductor layers 106 and second semiconductor layers 108, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the first semiconductor layers 106 are made of a first semiconductor material and the second semiconductor layers 108 are made of a second semiconductor material with a different composition than the first semiconductor material. The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity. In some embodiments, the first semiconductor layers 106 are made of SiGe, where the percentage of germanium (Ge) in the SiGe is in a range from about 20 atomic % to about 50 atomic %, and the second semiconductor layers 108 are made of pure or substantially pure silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

The first semiconductor layers 106 are configured as sacrificial layers and will be removed to form gaps to accommodate gate materials, in accordance with some embodiments. The second semiconductor layers 108 will form nanostructures (e.g., nanowires or nanosheets) that laterally extend between source/drain features and serve as the channel for the resulting semiconductor device (such as a nanostructure transistor), in accordance with some embodiments. As the term is used herein, "nanostructures" refers to semiconductor layers that have cylindrical shape, bar shaped and/or sheet shape. Gate stack (not shown) will be formed across and wrap around the nanostructures, in accordance with some embodiments. Although three first semiconductor layers 106 and three second semiconductor layers 108 are shown in FIGS. 2A-1 and 2A-3, the number is not limited to three, and can be two or four, and is less than ten.

In some embodiments, the thickness of each of the first semiconductor layers 106 is in a range from about 3 nm to about 20 nm, such as about 4 nm to about 12 nm. In some embodiments, the thickness of each of the second semiconductor layers 108 is in a range from about 3 nm to about 20 nm, such as about 4 nm to about 12 nm. The thickness of the second semiconductor layers 108 may be greater than, equal to, or less than the first semiconductor layers 106, which may depend on the amount of gate materials to be filled in spaces where the first semiconductor layers 106 are removed.

The formation of the active regions 104 further includes patterning the epitaxial stack and the underlying substrate 102 using photolithography and etching processes, thereby forming trenches and the active regions 104 protruding from between trenches, in accordance with some embodiments. The portion of the substrate 102 protruding from between the trenches serves as lower fin elements 104L of the active regions 104, in accordance with some embodiments. The remainder of the epitaxial stack (including the first semiconductor layers 106 and the second semiconductor layers 108) serves as the upper fin elements of the active regions 104, in accordance with some embodiments. In some embodiments, the active regions 104 are the fin structures 104 as shown in FIG. 1.

Figures 1, 2, 2A, 3:
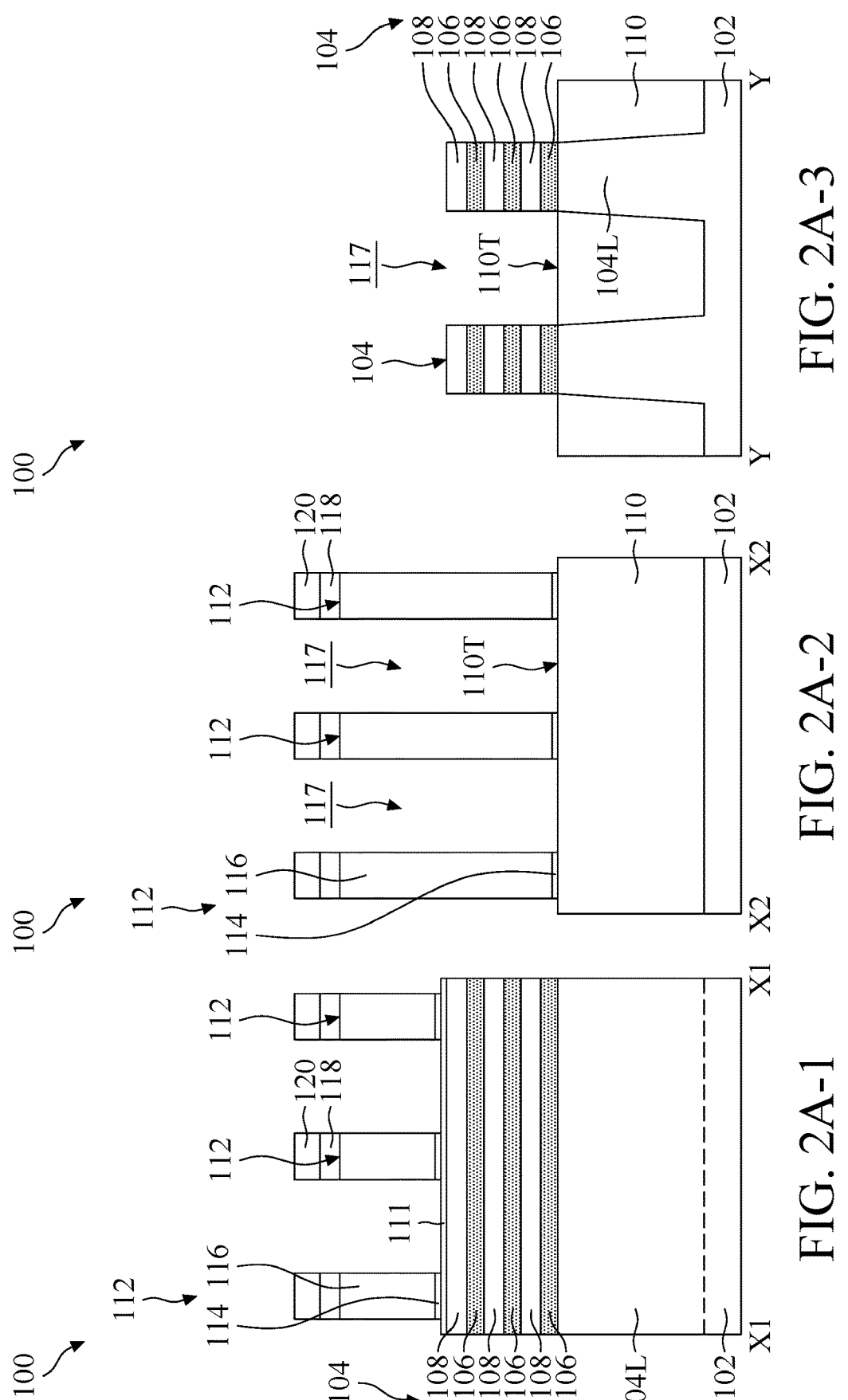

An isolation structure 110 is formed to surround the lower fin elements 104L of the active regions 104, as shown in FIGS. 2A-2 and 2A-3, in accordance with some embodiments. The bottom surface of the isolation structure 110 is illustrated as a dashed line in FIG. 2A-1. The isolation structure 110 is configured to electrically isolate active regions 104 of the semiconductor structure 100 and is also referred to as shallow trench isolation (STI) feature, in accordance with some embodiments.

The formation of the isolation structure 110 includes forming an insulating material to overfill the trenches, in accordance with some embodiments. In some embodiments, the insulating material is made of silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, the insulating material is deposited using CVD (such as flowable CVD (FCVD), low-pressure CVD (LPCVD), plasma-enhanced CVD (PECVD), high density plasma CVD (HDP-CVD), or high aspect ratio process (HARP)), atomic layer deposition (ALD), another suitable technique, or a combination thereof.

A planarization process is performed on the insulating material to remove a portion of the insulating material above the active regions 104, in accordance with some embodiments. The planarization may be chemical mechanical polishing (CMP), etching back process, or a combination thereof. The insulating material is then recessed by an etching process (such as dry plasma etching and/or wet chemical etching) until the sidewalls of the upper fin elements of the active regions 104 are exposed, in accordance with some embodiments. The remaining insulating material serves as the isolation structure 110, in accordance with some embodiments.

In some embodiments, the isolation structure 110 has a top surface 110T that is leveled with the top surfaces of the lower fin elements 104L. In some embodiments, the top surface 110T of the isolation structure 110 is a substantially flat surface (e.g., linear).

A semiconductor capping layer 111 is formed on the exposed surface of the upper fin elements of the active regions 104 using an epitaxial growth process, as shown in FIGS. 2A-1 and 2A-3, in accordance with some embodiments. In some embodiments, the semiconductor capping layer 111 are made of semiconductor material such as silicon or silicon germanium. The epitaxial growth process may be MBE, MOCVD, or VPE, another suitable technique, or a combination thereof. In some embodiments, the semiconductor capping layer 111 may substantially be not formed along the dielectric surface of the isolation structure 110 due to the characteristics of the epitaxial growth process.

Dummy gate structures 112 are formed across the active regions 104 and the isolation structure 110, as shown in FIGS. 2A-1 and 2A-2. The dummy gate structures 112 are configured as sacrificial structures and will be replaced with the final gate stacks, in accordance with some embodiments. In some embodiments, the dummy gate structures 112 extend in the Y direction. That is, the dummy gate structures 112 have longitudinal axes parallel to the Y direction, in accordance with some embodiments. That is, the dimensions (lengths) of the dummy gate structures 112 in the Y direction are greater than the dimensions (widths) of the dummy gate structures 112 in the X direction. The dummy gate structures 112 surround the channel regions of the active regions 104, in accordance with some embodiments. The dummy gate structures 112 may be the gate structures 112 shown in FIG. 1. In some embodiments, the sidewalls of the dummy gate structures 112 and the sidewalls of the active regions 104 together define spaces 117.

Each of the dummy gate structures 112 includes a dummy gate dielectric layer 114 and a dummy gate electrode layer 116 formed over the dummy gate dielectric layer 114, as shown in FIGS. 2A-1 and 2A-2, in accordance with some embodiments. In some embodiments, the dummy gate dielectric layer 114 is conformally formed along the upper fin elements of the active regions 104. In some embodiments, the dummy gate dielectric layer 114 is made of one or more dielectric materials, such as silicon oxide (SiO), silicon nitride (SiN), silicon oxynitride (SiON), $HfO_2$, HfZrO, HfSiO, HfTiO, HfAlO. In some embodiments, the dielectric material is deposited using ALD, CVD, thermal oxidation, physical vapor deposition (PVD), another suitable technique, or a combination thereof.

In some embodiments, the dummy gate electrode layer 116 is made of semiconductor material such as polysilicon or poly-silicon germanium. In some embodiments, the material for the dummy gate electrode layer 116 is deposited using CVD, ALD, another suitable technique, or a combination thereof. In some embodiments, the formation of the dummy gate structures 112 includes globally and conformally depositing a dielectric material for the dummy gate dielectric layer 114 over the semiconductor structure 100, depositing a material for the dummy gate electrode layer 116 over the dielectric material, planarizing the material for the dummy gate electrode layer 116, and patterning the material for the dummy gate electrode layer 116 and the dielectric material into the dummy gate structures 112.

The patterning process includes forming patterned hard mask layers 118 and 120 over the material for the dummy gate electrode layer 116, in accordance with some embodiments. For example, the patterned hard mask layer 118 is made of nitride such as silicon nitride, and the patterned hard mask layer 120 is made of oxide such as silicon oxide. The patterned hard mask layers 118 and 120 correspond to and overlap the channel region of the active regions 104, in accordance with some embodiments. The materials for the dummy gate dielectric layer 114 and the dummy gate electrode layer 116, uncovered by the patterned hard mask layer, are etched away until the semiconductor capping layer 111 and the top surface 110T of the isolation structure 110 are exposed, in accordance with some embodiments.

FIGS. 2B-1 to 2B-3 illustrate a semiconductor structure 100 after the formation of a spacer layer 122, in accordance with some embodiments. FIG. 2B-4 is a plan view illustrating the semiconductor structure 100 taken along plan A-A shown in FIGS. 2B-1 and 2B-3, in accordance with some embodiments.

Figures 1, 2, 2B, 3:
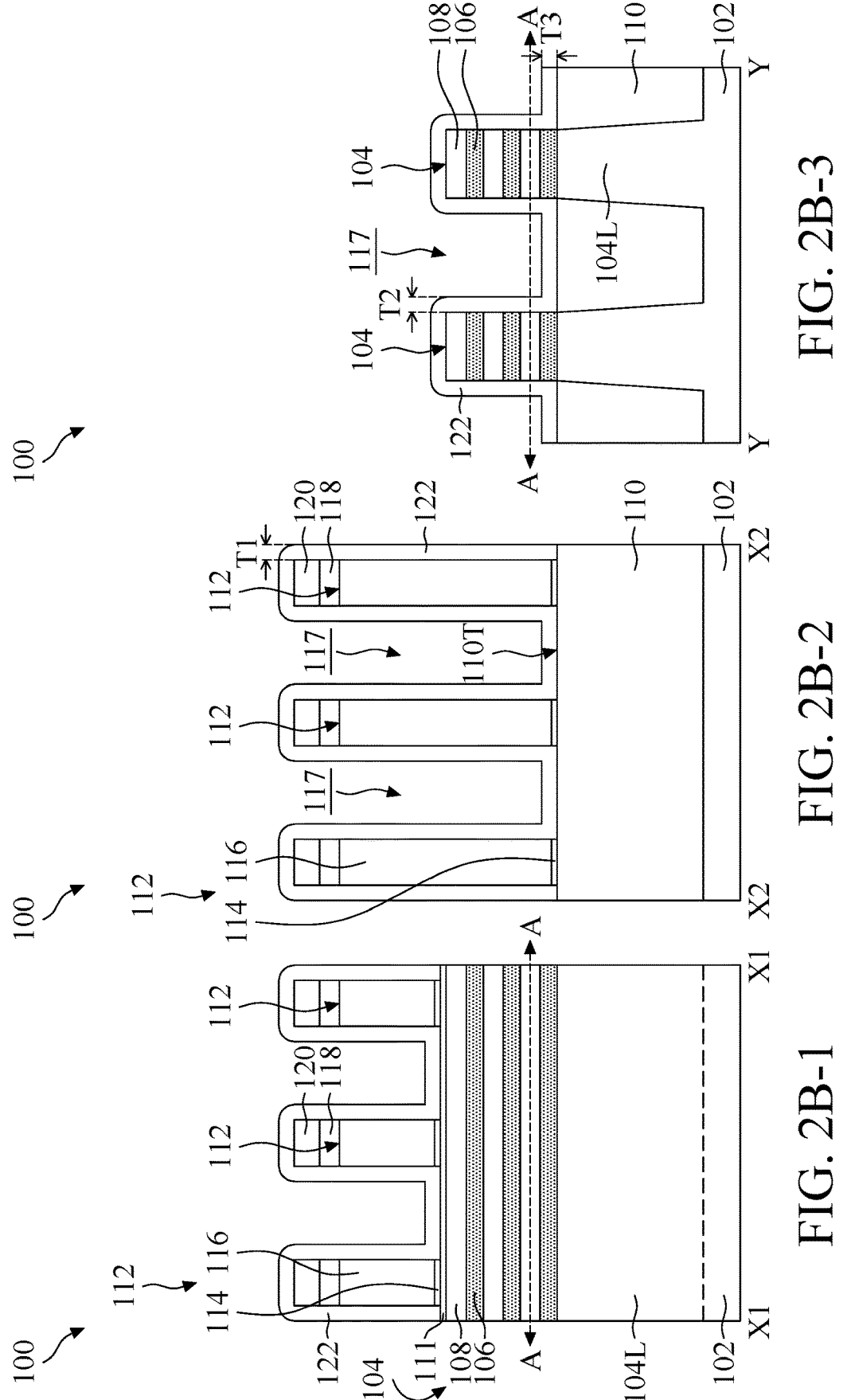

Spacer layer 122 is formed over the semiconductor structure 100, as shown in FIGS. 2B-1 to 2B-4, in accordance with some embodiments. The spacer layer 122 partially fills the spaces 117 defined by the dummy gate structures 112 and the active regions 104, in accordance with some embodiments. The spacer layer 122 is formed along, and covers, the top surfaces and the sidewalls of the patterned mask layer 120, the sidewalls of the patterned mask layers 118 and the sidewalls of the dummy gate structures 112, as shown in FIGS. 2B-1, 2B-2 and 2B-4, in accordance with some embodiments. The spacer layer 122 is further formed along, and covers, the top surface 110T of the isolation structure 110, as shown in FIGS. 2B-2, 2B-3 and 2B-4, in accordance with some embodiments. The spacer layer 122 is further formed further along, and covers, the exposed surfaces of the semiconductor capping layer 111 (that is formed on the top surfaces and the sidewalls of the upper fin elements), as shown in FIG. 2B-3, in accordance with some embodiments.

In some embodiments, the spacer layer 122 is made of a dielectric material, such as silicon nitride (SiN), silicon oxynitride (SiON), silicon oxide ($SiO_2$), oxygen-doped silicon carbide (SiC:O), oxygen-doped silicon carbonitride (Si(O)CN), silicon carbide (SiC), another suitable dielectric material, a multilayer thereof, or a combination thereof. In some embodiments, the spacer layer 122 is made of low-k dielectric materials. For example, the dielectric constant (k) values of the spacer layer 122 may be lower than the k-value of silicon oxide (SiO), such as lower than 4.2, equal to or lower than about 3.9, such as in a range from about 3.5 to about 3.9.

In some embodiment, the spacer layer 122 is a single layer formed of a homogeneous dielectric material. In alternative embodiments, the spacer layer 122 is a multilayer structure formed of at least two different dielectric materials. In some embodiments, the spacer layer 122 is globally and conformally deposited using atomic layer deposition (ALD), CVD (such as LPCVD, PECVD, HDP-CVD and HARP), another suitable method, and/or a combination thereof.

In some embodiments, the spacer layer 122 has a thickness T1 along the sidewalls of the dummy gate structure 112 (measured in the X direction), a thickness T2 along the sidewalls of the active regions 104 (measured in the Y direction), and a thickness T3 along the top surface 110T of the isolation structure 110 (measured in the Z direction). In some embodiments, the thickness T1, the thickness T2 and the thickness T3 are substantially the same, for example, the difference between any of them is within 10%, or even within 5%, of the average thickness of thicknesses T1, T2, and T3. In some embodiments, the thickness T1, thickness T2, and thickness T3 are in a range from about 10 angstroms (Å) to about 150 Å.

FIGS. 2C-1 to 2C-3 illustrate a semiconductor structure 100 after the formation of a sacrificial material 124, in accordance with some embodiments.

A sacrificial material 124 is formed over the spacer layer 122, as shown in FIGS. 2C-1 to 2C-3, in accordance with some embodiments. The sacrificial material 124 overfills the remainder of the spaces 117, in accordance with some embodiments. The sacrificial material 124 is configured to protect the underlying isolation structure 110, which will be discussed in detail later.

In some embodiments, the sacrificial material 124 is made of dielectric material such as silicon oxide ($SiO_2$), silicon oxynitride (SiON), oxygen-doped silicon carbide (SiC:O), oxygen-doped silicon carbonitride (Si(O)CN), silicon nitride (SiN), or another suitable dielectric material. In some embodiments, the sacrificial material 124 and the spacer layer 122 are made of different materials and have a great difference in etching selectivity. In some embodiments, the sacrificial material 124 is deposited using CVD (such as FCVD, LPCVD, PECVD, HDP-CVD, and HARP), ALD, spin-on coating process, another suitable technique, or a combination thereof.

In an embodiment, the sacrificial material 124 is a silicon oxide layer which is formed by FCVD, and the sacrificial material 124 is free of void therein. In an embodiment, the sacrificial material 124 is made of a bottom anti-reflective coating (BARC) material such as an inorganic material or an organic material (e.g., polymer, oligomer, or monomer).

FIGS. 2D-1 to 2D-3 illustrate a semiconductor structure 100 after an etching process, in accordance with some embodiments. FIG. 2D-4 is a plan view illustrating the semiconductor structure 100 taken along plan A-A shown in FIGS. 2D-1 and 2D-3, in accordance with some embodiments.

An etching process is performed on the sacrificial material 124 to thin down the sacrificial material 124, as shown in FIGS. 2D-1 to 2D-4, in accordance with some embodiments. The sacrificial material 124 is recessed to expose the spacer layer 122, as shown in FIGS. 2D-1 to 2D-4, in accordance with some embodiments. The etching process may be an anisotropic etching process such as dry plasma etching, an isotropic etching process such as dry chemical etching, remote plasma etching or wet chemical etching, or a combination thereof.

The horizontal portions of the spacer layer 122 formed along the top surfaces of the patterned mask layer 120 and formed along the top surfaces of the active regions 104 are entirely exposed, in accordance with some embodiments. The vertical portions of the spacer layer 122 formed along the sidewalls of the dummy gate structure 112 and formed along the sidewalls of the upper fin elements are partially exposed, in accordance with some embodiments. The horizontal portions of the spacer layer 122 formed along the top surfaces 110T of the isolation structure 110 remain covered, in accordance with some embodiments.

Figures 2, 2B, 3, 4:
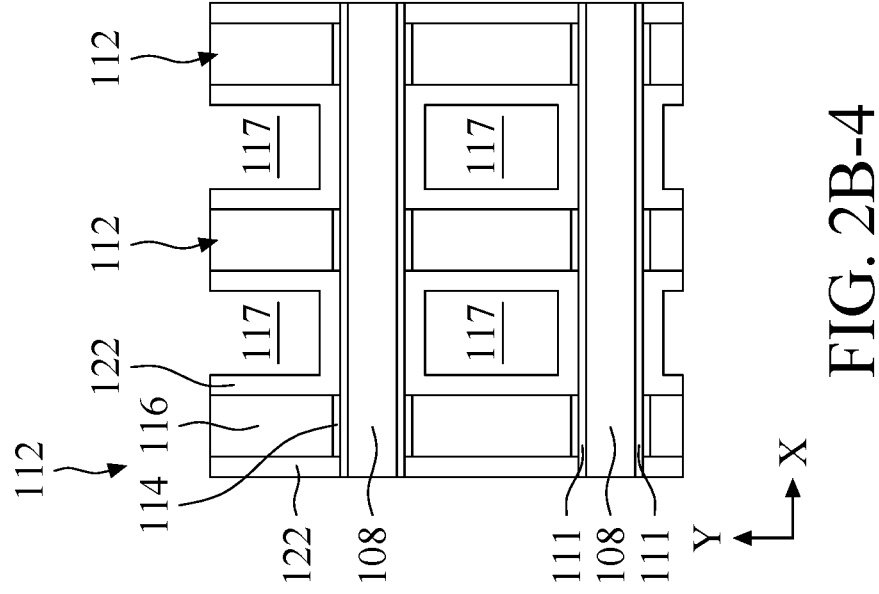
Figures 2C-1, 2C-2, 2C-3:
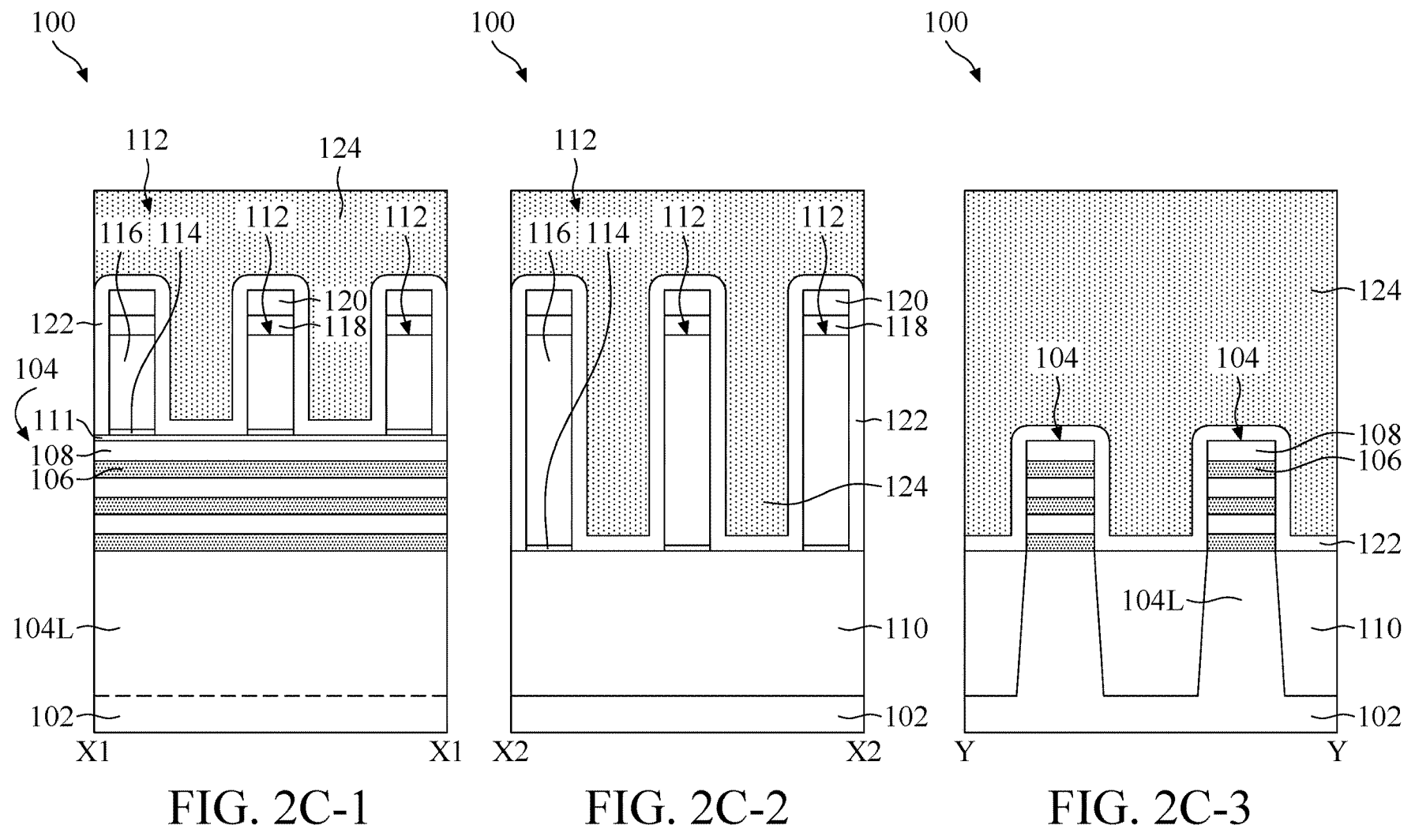
Figures 1, 2, 2D, 3:
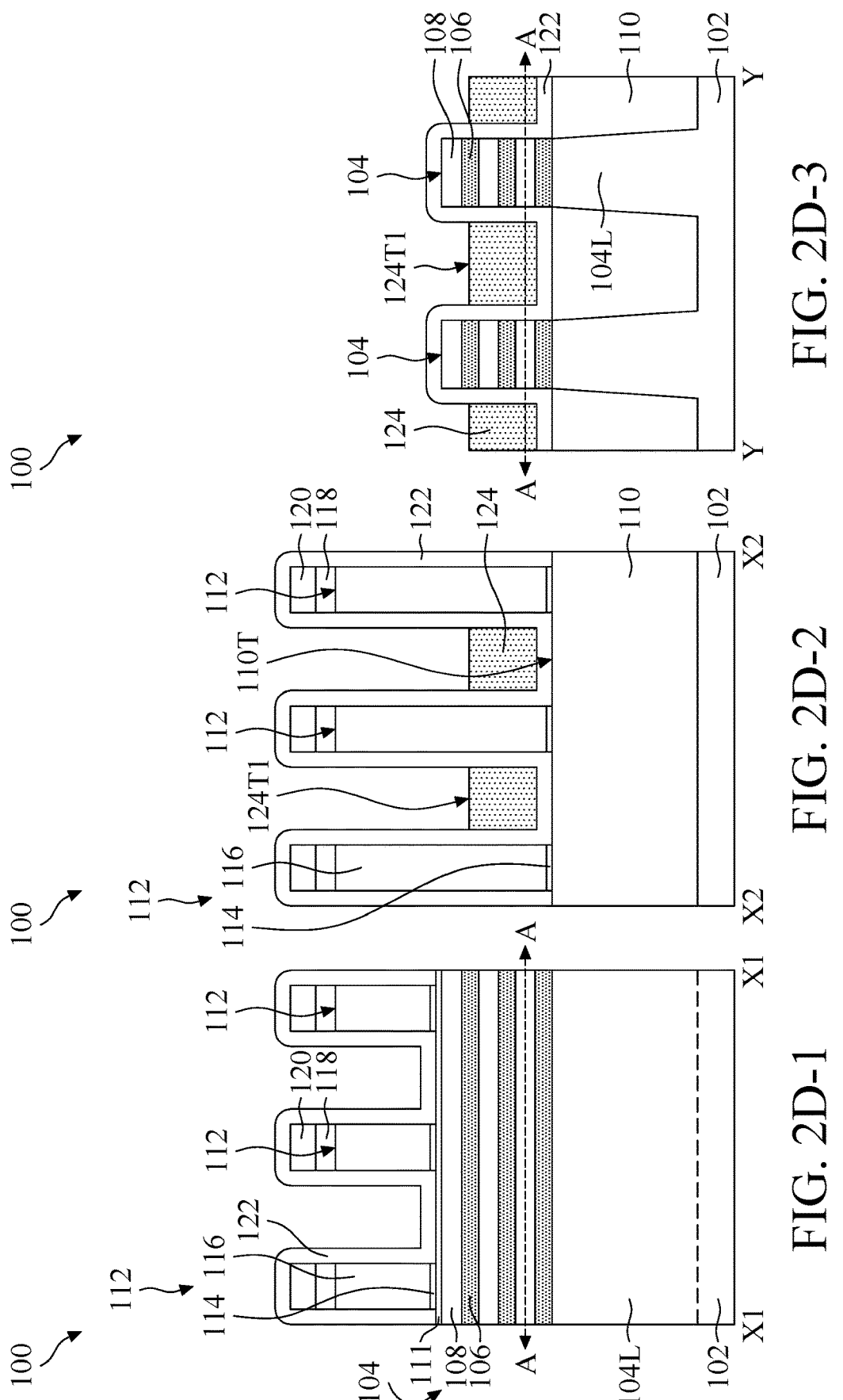
Figures 2, 2D, 3, 4:
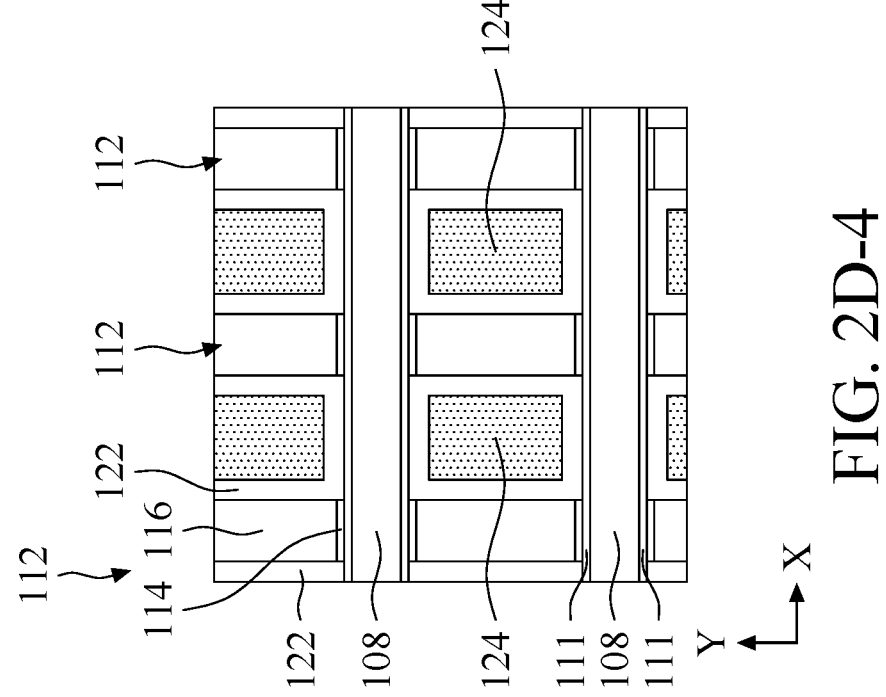

The recessed sacrificial material 124 has a top surface 124T1 that is located between the top surface and the bottom surface of the uppermost first semiconductor layer 106, as shown in FIG. 2D-3, in accordance with some embodiments. If the position of the top surface 124T1 is too high, the endpoint of the etching process for recessing the sacrificial material 124 may be hard to control, and the horizontal portions of the spacer layer 122 formed along the top surfaces of the active regions 104 may remain covered. If the position of the top surface 124T1 is too low, the sacrificial material 124 may not sufficiently protect the underlying isolation structure 110.

In some embodiments, the top surface 124T1 is a substantially flat surface (e.g., linear). In some embodiments, in a cross-sectional view (e.g., FIG. 2D-2 or 2D-3), the top surface 124T1 continuously extends in the horizontal direction (e.g., the X direction or the Y direction) from a vertical portion of the spacer layer 122 (e.g., formed on the sidewall of a dummy gate structure 112 or formed on the sidewall of an active region 104) to another vertical portion of the spacer layer 122 (e.g., formed on the sidewall of another dummy gate structure 112 or formed on the sidewall of another active region 104). In alternative embodiments, the top surface 124T1 may be curved (e.g., concave).

FIGS. 2E-1 to 2E-3 illustrate a semiconductor structure 100 after an etching process, in accordance with some embodiments.

An etching process is performed on the semiconductor structure 100, in accordance with some embodiments. The etching process removes the horizontal portions of the spacer layer 122 formed along the top surfaces of the patterned mask layer 120 and formed along the top surfaces of the active regions 104, as shown in FIGS. 2E-1 to 2E-3, in accordance with some embodiments. The etching process may be an anisotropic etching process such as dry plasma etching, an isotropic etching process such as dry chemical etching, remote plasma etching or wet chemical etching, and/or a combination thereof. The sacrificial material 124 protects the horizontal portions of the spacer layer 122 formed along the top surface 110T of the isolation structure 110 and the underlying isolation structure 110 from being recessed in the etching process, in accordance with some embodiments.

Figures 1, 2, 2E, 3:
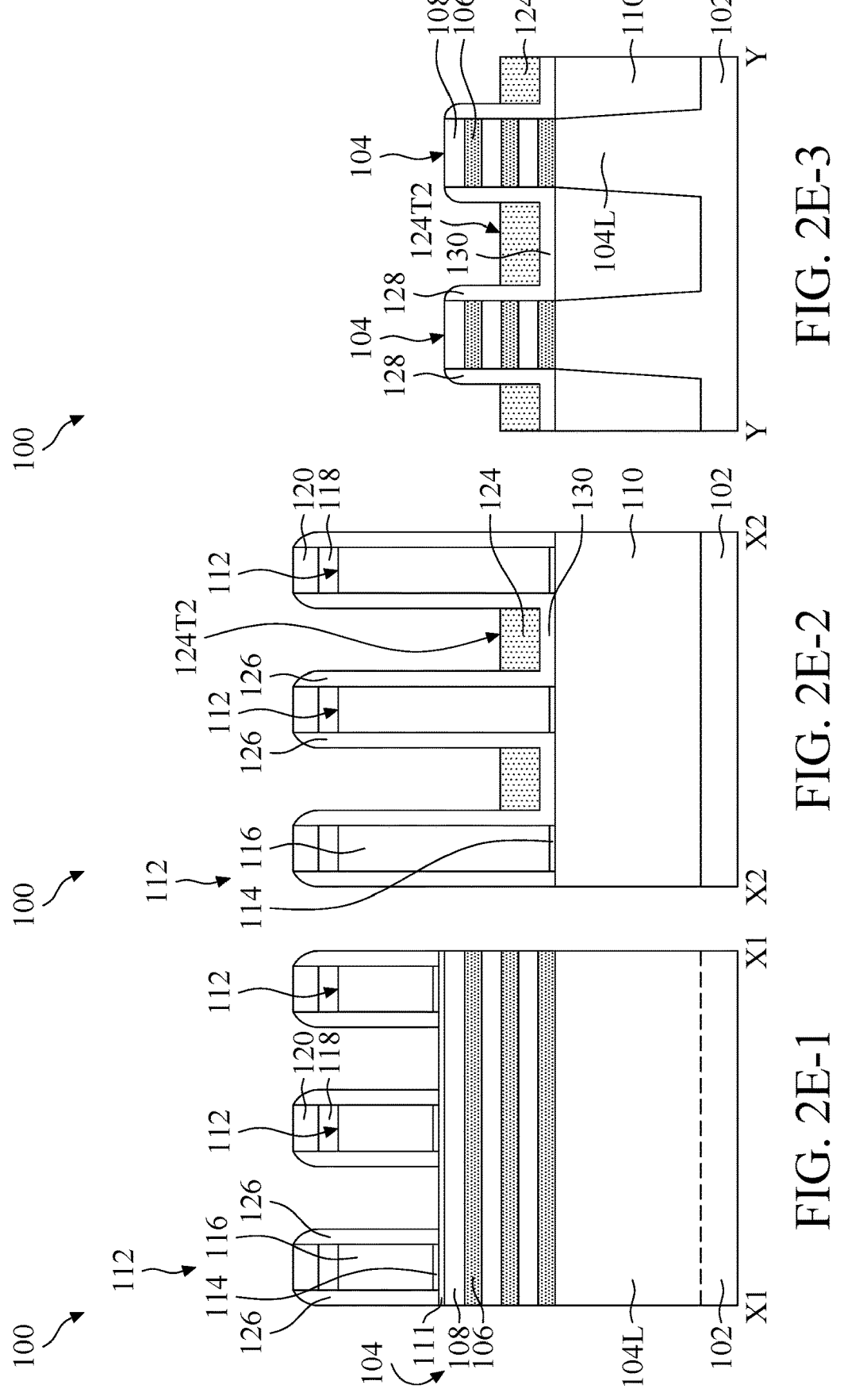

The vertical portions of the spacer layer 122 left remaining on the opposite sidewalls of the dummy gate structure 112 serve as gate spacers 126, as shown in FIG. 2E-1 and 2E-2, in accordance with some embodiments. The vertical portions of the spacer layer 122 left remaining on the opposite sides of the active regions 104 serve as fin spacers 128, as shown in FIG. 2D-3, in accordance with some embodiments. The etching process partially etches the top portions of the gate spacers 126 and the fin spacers 128 such that the gate spacers 126 and the fin spacers 128 have round top surfaces, in accordance with some embodiments.

The horizontal portions of the spacer layer 122 formed along the top surface 110T of the isolation structure 110 serve as protection layers 130, as shown in FIG. 2D-3, in accordance with some embodiments. The protection layers 130 continuously and horizontally extend between the gate spacers 126 and between the fin spacers 128, in accordance with some embodiments. The protection layers 130 are configured to protect the underlying isolation structure 110, in accordance with some embodiments.

In some cases where the sacrificial material is not formed, the horizontal portions of the spacer layer are completely removed, and thus the isolation structure is exposed and may be seriously recessed in the etching process for forming the gate spacers and fin spacers and following several etching processes. As a result, the risk that the dummy gate structures will collapse may increase. In addition, in some cases where the isolation structure is seriously recessed, the risk of exposing the lower fin elements of the active regions may increase, which may cause the subsequently formed epitaxial material to grow on the exposed lower fin elements. As a result, the manufacturing yield and the performance of the resulting semiconductor may degrade. That will be discussed in detail later.

The sacrificial material 124 is consumed and thinned down in the etching process, in accordance with some embodiments. The recessed sacrificial material 124 has a top surface 124T2 that is located between the top surface and the bottom surface of the second uppermost second semiconductor layer 108, as shown in FIG. 2E-3, in accordance with some embodiments. In some embodiments, the top surface 124T2 is a substantially flat surface (e.g., linear). In some embodiments, in a cross-sectional view (e.g., FIG. 2E-2 or 2E-3), the top surface 124T2 continuously extends in the horizontal direction (e.g., the X direction or the Y direction) from one gate spacer 126 to another gate spacer 126 or from one fin spacer 128 to another fin spacer 128. In alternative embodiments, the top surface 124T2 may be curved (e.g., concave).

FIGS. 2F-1 to 2F-3 illustrate a semiconductor structure 100 after an etching process, in accordance with some embodiments.

An etching process is performed to remove the semiconductor capping layer 111 and recess the source/drain regions of the active regions 104, thereby forming source/drain recesses 132, as shown in FIGS. 2F-1 and 2F-3, in accordance with some embodiments. The second semiconductor layers 108 are illustrated as dashed lines in FIGS. 2F-3. The etching process may be an anisotropic etching process such as dry plasma etching, an isotropic etching process such as dry chemical etching, remote plasma etching or wet chemical etching, and/or a combination thereof. In some embodiments, etching the space layer 122 and etching the source/drain regions of the active regions 104 are subsequently performed in the same etch tool and with different process parameters.

The source/drain recesses 132 extend into the lower fin elements 104L, in accordance with some embodiments. In some embodiments, the source/drain recesses 132 expose the fin spacers 132 and the isolation structure 110, in accordance with some embodiments. The gate spacers 126 and the dummy gate structures 112 may serve as etch masks such that the source/drain recesses 132 are formed self-aligned opposite sides of the dummy gate structures 112, in accordance with some embodiments.

Figures 1, 2, 2F, 3:
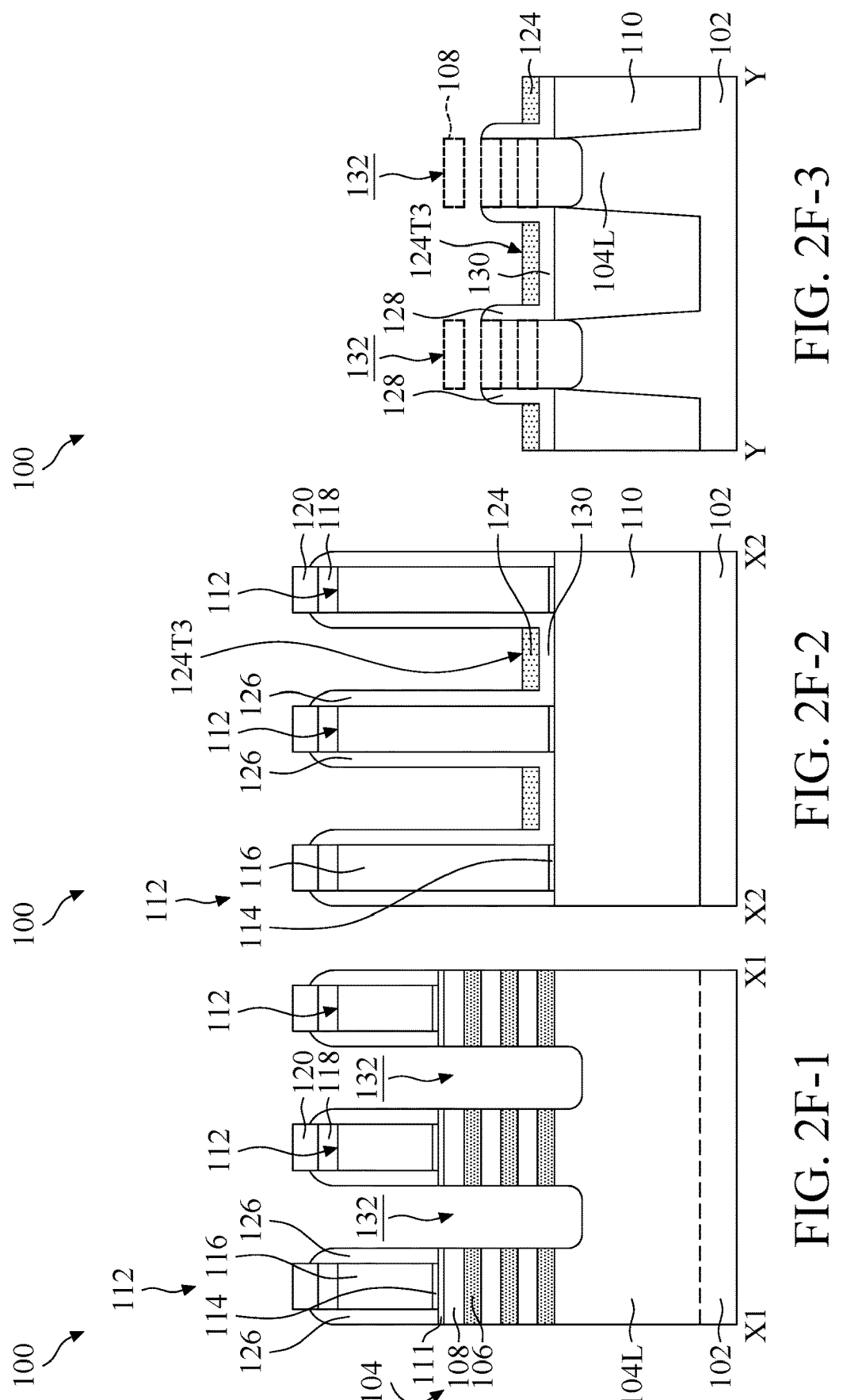

In some embodiments, the gate spacers 126 and the fin spacers 128 are recessed in the etching process. The sacrificial material 124 protects the protection layers 130 and the underlying isolation structure 110 from being recessed in the etching process, in accordance with some embodiments. The sacrificial material 124 is further consumed and thinned down in the etching process, in accordance with some embodiments. The recessed sacrificial material 124 has a top surface 124T3 that is located between the top surface and the bottom surface of the bottommost second semiconductor layer 108, as shown in FIG. 2F-3, in accordance with some embodiments.

In some embodiments, the top surface 124T3 is a substantially flat surface (e.g., linear). In some embodiments, in a cross-sectional view (e.g., FIG. 2F-2 or 2F-3), the top surface 124T3 continuously extends in the horizontal direction (e.g., the X direction or the Y direction) from one gate spacer 126 to another gate spacer 126 or from one fin spacer 128 to another fin spacer 128. In alternative embodiments, the top surface 124T3 may be curved (e.g., concave).

FIGS. 2G-1 to 2G-3 illustrate a semiconductor structure 100 after an etching process, in accordance with some embodiments.

Figures 1, 2, 2G, 3:
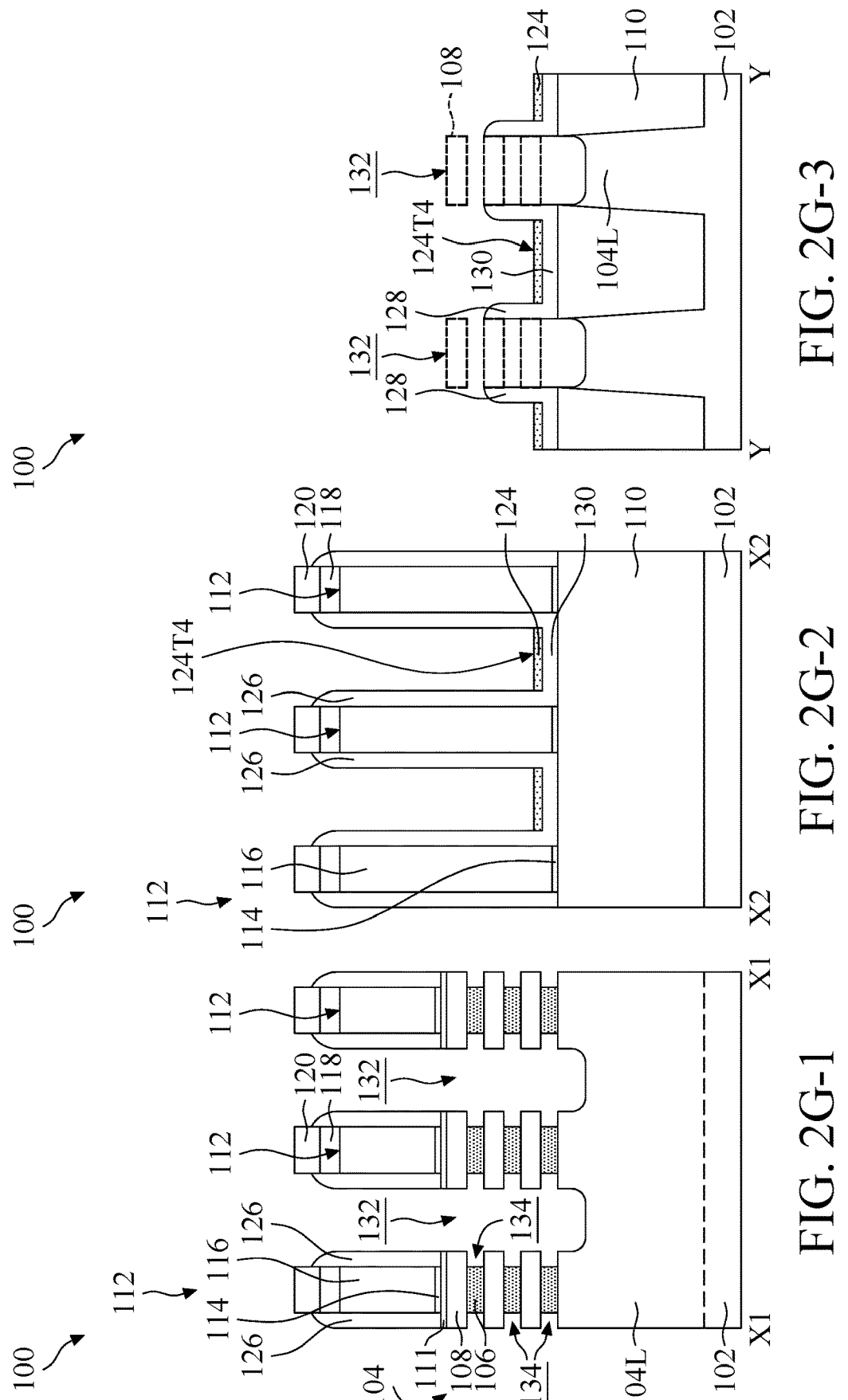

An etching process is performed to laterally recess, from the source/drain recesses 132 toward the channel regions, the first semiconductor layers 106 of the active regions 104, thereby forming notches 134, as shown in FIG. 2G-1, in accordance with some embodiments. In some embodiments, the etching process is an isotropic etching such as dry chemical etching, remote plasma etching, wet chemical etching, another suitable technique, or a combination thereof. The notches 134 are formed between adjacent second semiconductor layers 108 and between the lowermost second semiconductor layer 108 and the lower fin element 104L, in accordance with some embodiments. In some embodiments, the notches 134 are located directly below the gate spacers 126.

The sacrificial material 124 protects the protection layers 130 and the underlying isolation structure 110 from being recessed in the etching process, in accordance with some embodiments. The sacrificial material 124 is further consumed and thinned down in the etching process, in accordance with some embodiments. The recessed sacrificial material 124 has a top surface 124T4 that is located between the top surface and the bottom surface of the bottommost second semiconductor layer 108, as shown in FIGS. 2G-2 and 2G-3, in accordance with some embodiments.

In some embodiments, the top surface 124T4 is a substantially flat surface (e.g., linear). In some embodiments, in a cross-sectional view (e.g., FIG. 2G-2 or 2G-3), the top surface 124T4 continuously extends in the horizontal direction (e.g., the X direction or the Y direction) from one gate spacer 126 to another gate spacer 126 or from one fin spacer 128 to another fin spacer 128. In alternative embodiments, the top surface 124T2 may be curved (e.g., concave). In alternative embodiments, the sacrificial material 124 may be entirely removed in the etching process, and the protection layers 130 are exposed.

FIGS. 2H-1 to 2H-3 illustrate a semiconductor structure 100 after the formation of inner spacers 136, in accordance with some embodiments. FIGS. 2H-4 and 2H-5 are plan views illustrating the semiconductor structure 100 respectively taken along plan A-A and plan B-B shown in FIGS. 2H-1 and 2H-3, in accordance with some embodiments.

Figures 1, 2, 2H, 3:
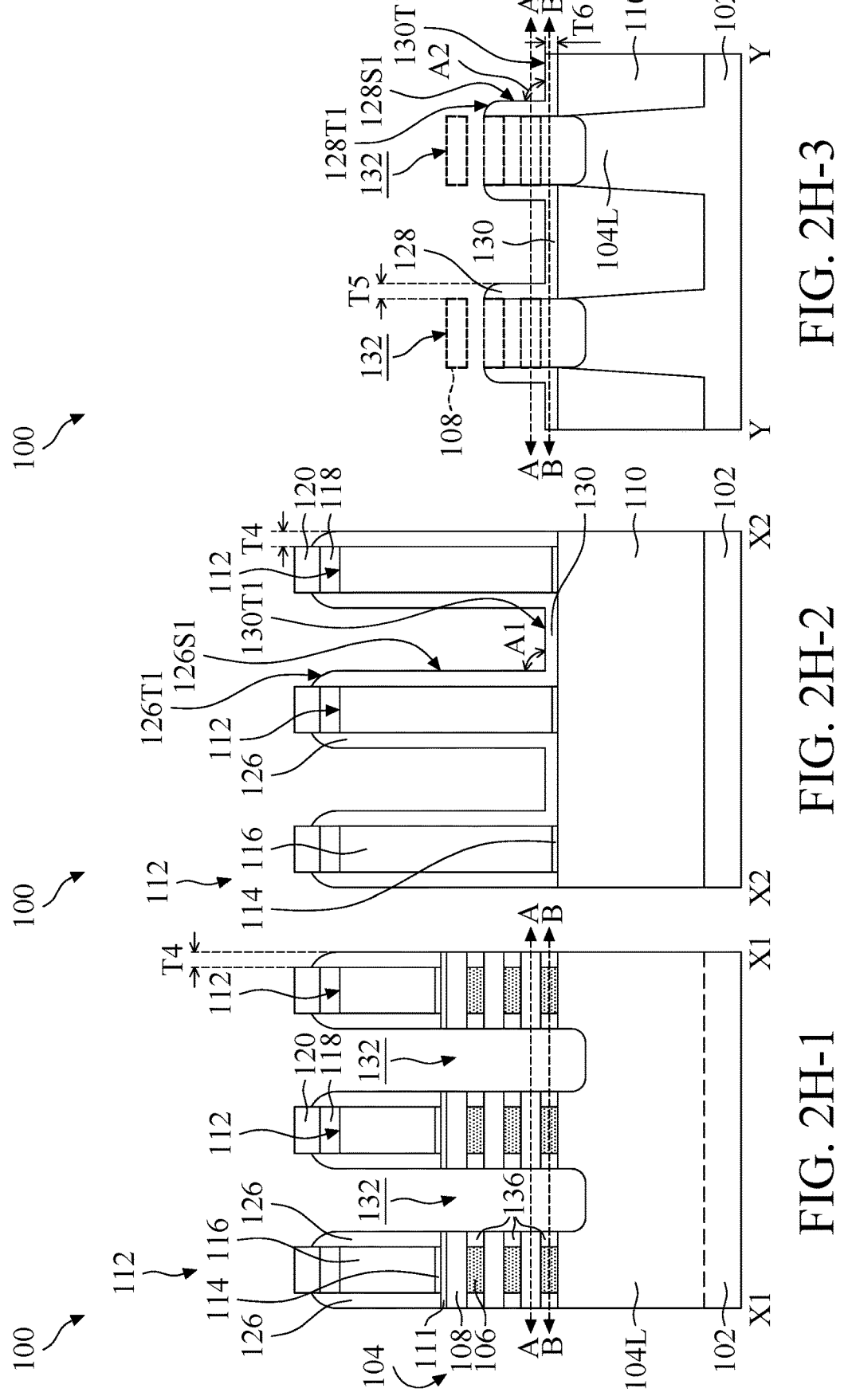

Inner spacers 136 are formed in the notches 134, as shown in FIG. 2H-1, in accordance with some embodiments. The inner spacers 136 are formed to abut the sidewalls of the first semiconductor layers 106, in accordance with some embodiments. In some embodiments, the inner spacers 136 are located between adjacent second semiconductor layers 108 and between the lowermost second semiconductor layer 108 and the lower fin element 104L. In some embodiments, the inner spacers 136 extend directly below the gate spacers 126, in accordance with some embodiments. The inner spacers 136 may avoid the source/drain features and the gate stack from being in direct contact and are configured to reduce the parasitic capacitance (e.g., Cgs and Cgd) between the gate stack and the source/drain features, in accordance with some embodiments.

In some embodiments, the inner spacers 136 are made of dielectric material silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the inner spacers 136 is made of low-k dielectric materials. For example, the dielectric constant (k) value of the inner spacers 136 may be lower than a k-value of silicon oxide (SiO), such as lower than 4.2, equal to or lower than about 3.9, such as in a range from about 3.5 to about 3.9.

In some embodiments, the formation of the inner spacers 136 includes depositing a dielectric material for the inner spacers 136 over the semiconductor structure 100 to overfill the notches 134, and then etching away the portion of the dielectric material outside the notches 134. The portions of the inner spacers 136 remaining in the notches 134 serve the inner spacers 136, in accordance with some embodiments.

The sacrificial material 124 (if present) and the protection layers 130 protect the underlying isolation structure 110 from being recessed in the etching process for forming the inner spacers 136, in accordance with some embodiments. The sacrificial material 124 is completely consumed in the etching process, and the protection layers 130 are exposed, in accordance with some embodiments. In some embodiments, the protection layers 130 may be thinned down in the etching process. In alternative embodiments, the sacrificial material 124 is not completely removed in the etching process for forming the inner spacers 136, and may be completely removed using an additional process, such as etching or ashing process.

In some embodiments, after the etching processes described in FIGS. 2E-1 to 2H-3, the gate spacers 126 have a thickness T4 measured in the X direction; the fin spacers 128 have a thickness T5 measured in the Y direction; and the protection layers 130 have a thickness T6 measured in the Z direction. In some embodiments, the thickness T4 is equal to or greater than the thickness T5 and the thickness T6. In some embodiments, the ratio of the thickness T5 to the thickness T4 is in a range from about 0.5 to about 0.95. In some embodiments, the ratio of the thickness T6 to the thickness T4 is in a range from about 0.2 to about 0.95.

In some embodiments, the gate spacers 126 have sidewalls 126S1 facing away from the dummy gate structures 112 and rounding top surfaces 126T1 connecting to the sidewalls 126S1. In some embodiments, the sidewalls 126S1 of the gate spacers 126 are substantially flat surfaces (e.g., linear). In some embodiments, the protection layers 130 have exposed top surfaces 130T1 that are substantially flat surfaces (e.g., linear). In some embodiments, the sidewalls 126S1 of the gate spacers 126 meet with the top surfaces 130T1 of the protection layers 130 at a right or a substantially right angle A1 (e.g., 85 degrees to 95 degrees).

In some embodiments, the fin spacers 128 have sidewalls 128S1 facing away from the source/drain regions of the active regions 104 and rounding top surfaces 128T1 connecting to the sidewalls 128S1. In some embodiments, the sidewalls 128S1 of the fin spacers 128 are substantially flat surfaces (e.g., linear). In some embodiments, the sidewalls 128S1 of the fin spacers 128 meet with the top surfaces 130T1 of the protection layers 130 at a right or a substantially right angle A2 (e.g., 85 degrees to 95 degrees). In some embodiments, the top surfaces 130T1 of the protection layers 130 are lower than the bottom surface of the bottommost second semiconductor layer 108.

FIGS. 2I-1 to 2I-3 illustrate a semiconductor structure 100 after the formation of semiconductor isolation features 138, dielectric isolation feature 140 and source/drain features 142, in accordance with some embodiments.

Semiconductor isolation features 138 are formed in the source/drain recesses 132 on the lower fin elements 104L using an epitaxial growth process, as shown in FIGS. 2I-1 and 2I-3, in accordance with some embodiments. The epitaxial growth process may be MBE, MOCVD, or VPE, another suitable technique, or a combination thereof. In some embodiments, the semiconductor isolation features 138 are made of undoped epitaxial material such as intrinsic silicon, intrinsic silicon germanium and/or another suitable semiconductor material. For example, an impurity (or an n-type dopant and/or a p-type dopant) in the semiconductor isolation feature 138 has a concentration of less than about $10^{14}$ cm$^{-3}$.

Afterward, the dielectric isolation features 140 are formed in the source/drain recesses 132 on the semiconductor isolation features 138, as shown in FIGS. 2I-1 and 2I-3, in accordance with some embodiments. In some embodiments, the semiconductor isolation feature 138 and the dielectric isolation features 140 are configured to block the leakage path of the bottom planar transistor formed from the lower fin elements. In some embodiments, the dielectric isolation features 140 are made of silicon oxide (SiO$_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN).

In some embodiments, the formation of the dielectric isolation features 140 includes deposition a dielectric material for dielectric isolation features 140 over the semiconductor structure 100, and etching back the dielectric material. In some embodiments, the semiconductor isolation feature 138 are made of non-doped silicon, and the dielectric isolation features 140 are made silicon oxide. In some embodiments, forming the semiconductor isolation feature 142 may reduce the difficulty of the deposition and etching back processes for forming the dielectric isolation features 140.

The protection layers 130 protect the isolation structure 110 from being recessed in the etching process for forming the dielectric isolation features 140, in accordance with some embodiments. The protection layers 130 may be consumed and thinned down in the etching process, in accordance with some embodiments. In some embodiments, the recessed protection layers 130 have a thickness T6', and the ratio of the thickness T6' to the thickness T4 of the gate spacers 126 is in a range from about 0.2 to about 0.95.

Source/drain features 142 are formed over the dielectric isolation features 140 in the source/drain recesses 132 using an epitaxial growth process, as shown in FIGS. 2I-1 and 2I-3, in accordance with some embodiments. The epitaxial growth process may be MBE, MOCVD, or VPE, another suitable technique, or a combination thereof. The source/drain features 142 are formed on opposite sides of the dummy gate structures 112, in accordance with some embodiments.

In some embodiments, the source/drain features 142 grow on the semiconductor surfaces provided by the second semiconductor layers 108 and abut the inner spacers 136. The growth of the source/drain features 142 is initially confined by the fin spacers 128 such that the source/drain features 142 have a narrow body portion between the fin spacers 128, in accordance with some embodiments. Once source/drain features 142 grow to protrude from the fin spacers 128, the source/drain features 142 may grow to have facet surfaces that have specific crystalline orientations such that the source/drain features 142 has a wider head portion. Although the source/drain features 142 are illustrated as having the facet surfaces, the source/drain features 142 may have curved in some other embodiments.

In some embodiments, the source/drain features 142 are made of any suitable semiconductor material for n-type semiconductor devices or p-type semiconductor devices. In some embodiments, the source/drain features 142 are doped. The concentration of the dopant in the source/drain features 142 in a range from about $1 \times 10^{19}$ cm$^{-3}$ to about $6 \times 10^{21}$ cm$^{-3}$. An annealing process may be performed on the semiconductor structure 100 to active the dopants in the source/drain features 142, in accordance with some embodiments.

In some embodiments wherein the active regions 104 are to be formed as an N-type nanostructure device (such as n-channel GAA FET), the source/drain features 142 are made of semiconductor material such as SiP, SiAs, SiCP, SiC, Si, GaAs, another suitable semiconductor material, or a combination thereof. In some embodiments, the source/drain features 142 are doped with the n-type dopant during the epitaxial growth process. For example, the n-type dopant may be phosphorous (P) or arsenic (As). For example, the source/drain features 142 may be the epitaxially grown Si doped with phosphorous to form silicon:phosphor (Si:P) source/drain features and/or arsenic to form silicon:arsenic (Si:As) source/drain feature.

In some embodiments wherein the active regions 104 are to be formed as a P-type nanostructure device (such as p-channel GAA FET), the source/drain features 142 are made of semiconductor material such as SiGe, Si, GaAs, another suitable semiconductor material, or a combination thereof. In some embodiments, the source/drain features 142 are doped with the p-type dopant during the epitaxial growth process. For example, the p-type dopant may be boron (B) or $BF_2$. For example, the source/drain features 142 may be the epitaxially grown SiGe doped with boron (B) to form silicon germanium:boron (SiGe:B) source/drain feature.

In some cases where the sacrificial material and the protection layers are not formed, the above-mentioned etching processes (e.g., in FIGS. 2E-1 to 2I-3) may seriously recess the isolation structure, and may even cause the exposure of the lower fin elements. As a result, the epitaxial material for the source/drain features may grow on the exposed lower fin elements, and the epitaxial material which grows on the neighboring lower fin elements may merge with each other, thereby degrading the manufacturing yield and the performance of the resulting semiconductor device.

In the embodiments of the present disclosure, by forming the sacrificial material 124 and the protection layers 130 to protect the isolation structure 110, the risk that the dummy gate structures 112 will collapse may decrease. Furthermore, the risk of exposing the lower fin elements 104L of the active regions 104 may decrease, thereby preventing the merging of the source/drain features 142. Therefore, the reliability, manufacturing yield and performance of the resulting semiconductor structure may increase.

FIGS. 2J-1 to 2J-3 illustrate a semiconductor structure 100 after the formation of a contact etching stop layer (CESL) 144 and an interlayer dielectric layer (ILD) 146, in accordance with some embodiments.

A contact etching stop layer 144 is formed over the semiconductor structure 100 to cover the source/drain features 142, as shown in FIGS. 2J-1 to 2J-3, in accordance with some embodiments. The contact etching stop layer 144 is further formed along, and covers, the top surfaces 126T1 and the sidewalls 126S1 of the gate spacers 126, the top surfaces 128T1 and the sidewalls 128S1 of the fin spacers 128, and the top surfaces 130T1 of the protection layers 130, in accordance with some embodiments.

In some embodiments, the contact etching stop layer 144 is made of dielectric material, such as silicon nitride (SiN), silicon oxide ($SiO_2$), silicon oxynitride (SiOC), silicon carbide (SiC), oxygen-doped silicon carbide (SiC:O), oxygen-doped silicon carbonitride (Si(O)CN), or a combination thereof. In some embodiments, a dielectric material for the contact etching stop layer 144 is globally and conformally deposited over the semiconductor structure 100 using CVD (such as LPCVD, PECVD, HDP-CVD, or HARP), ALD, another suitable method, or a combination thereof.

Afterward, an interlayer dielectric layer 146 is formed over the contact etching stop layer 144, as shown in FIGS. 2J-1 to 2J-3, in accordance with some embodiments. The interlayer dielectric layer 146 overfills the space between dummy gate structures 112, in accordance with some embodiments. In some embodiments, the interlayer dielectric layer 146 is made of dielectric material, such as un-doped silicate glass (USG), doped silicon oxide such as borophosphosilicate glass (BPSG), fluoride-doped silicate glass (FSG), phosphosilicate glass (PSG), borosilicate glass (BSG), and/or another suitable dielectric material.

In some embodiments, the interlayer dielectric layer 146 and the contact etching stop layer 144 is made of different materials and have a great difference in etching selectivity. In some embodiments, the dielectric material for the interlayer dielectric layer 146 is deposited using such as CVD (such as HDP-CVD, PECVD, HARP or FCVD), another suitable technique, or a combination thereof. The dielectric materials for the contact etching stop layer 144 and the interlayer dielectric layer 146 above the top surface of the dummy gate electrode layer 116 are removed using such as CMP, in accordance with some embodiments. In some embodiments, the top portions of the gate spacers 126 are also removed.

FIGS. 2K-1 to 2K-3 illustrate a semiconductor structure 100 after the formation of gate trenches 148 and gaps 150, in accordance with some embodiments.

Figures 2, 2H, 3, 4, 5:
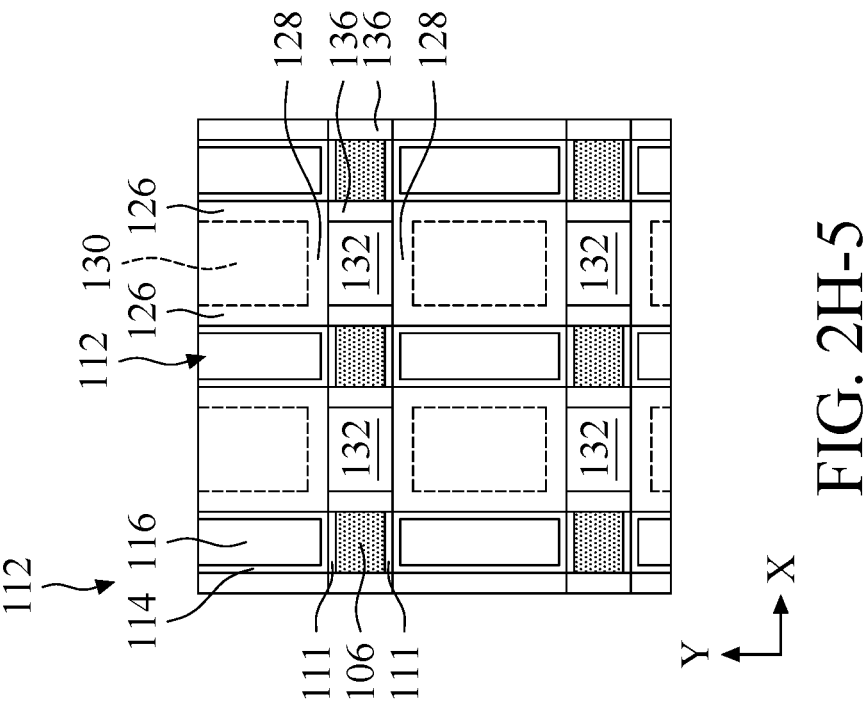
Figures 2, 2H, 3, 4:
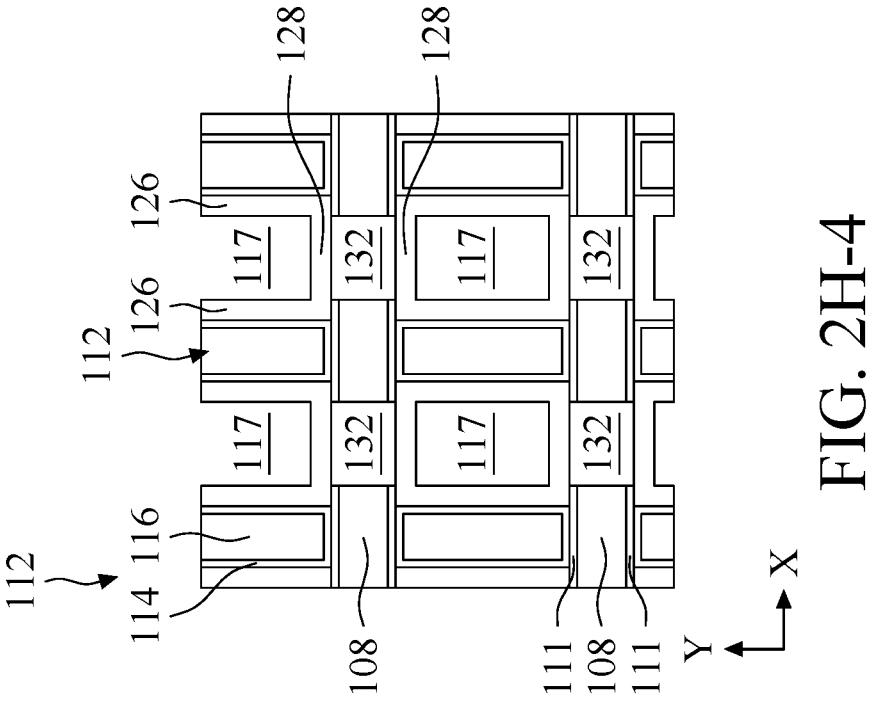
Figures 1, 2, 2I, 3:
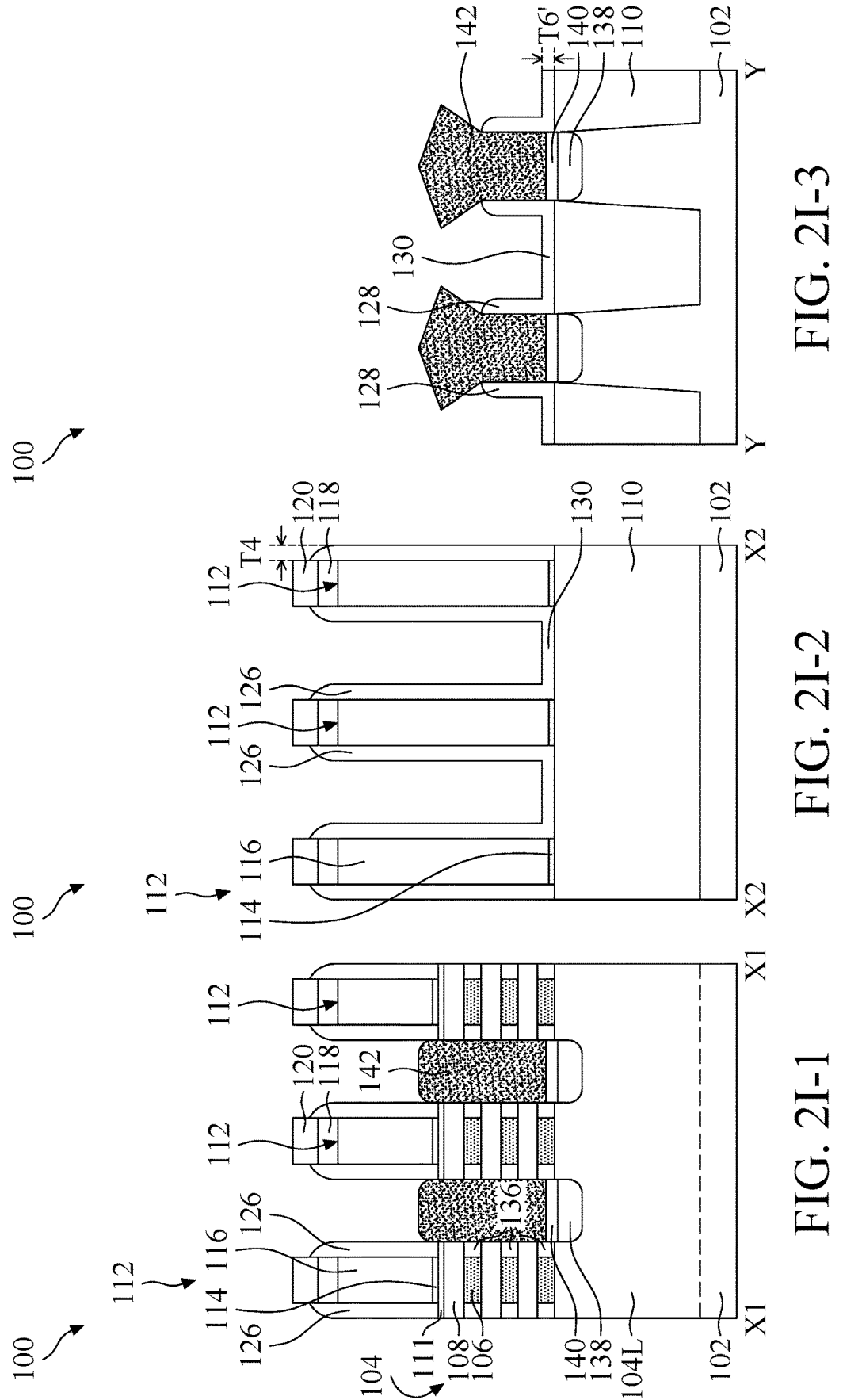
Figures 1, 2, 2J, 3:
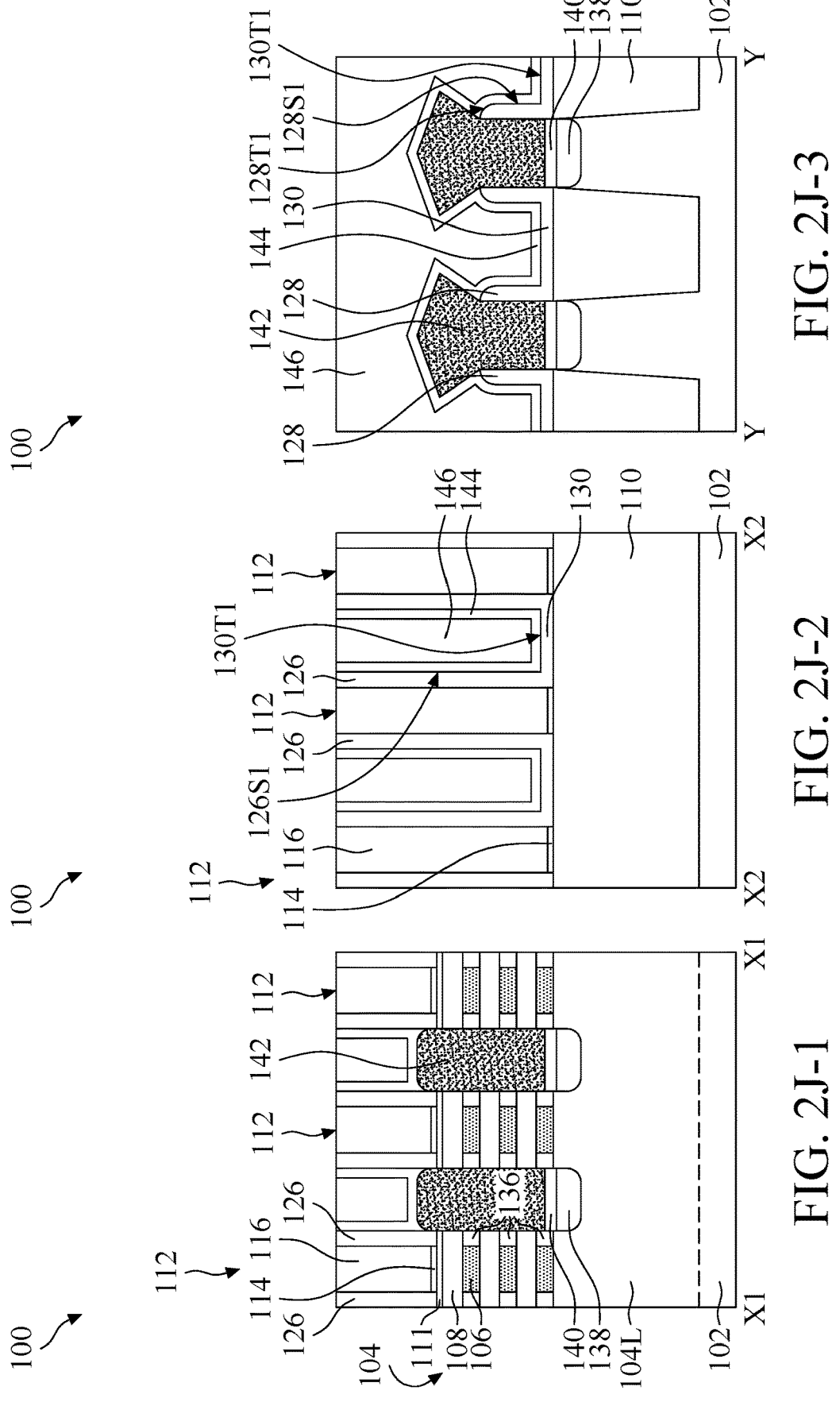
Figures 1, 2, 2K, 3:
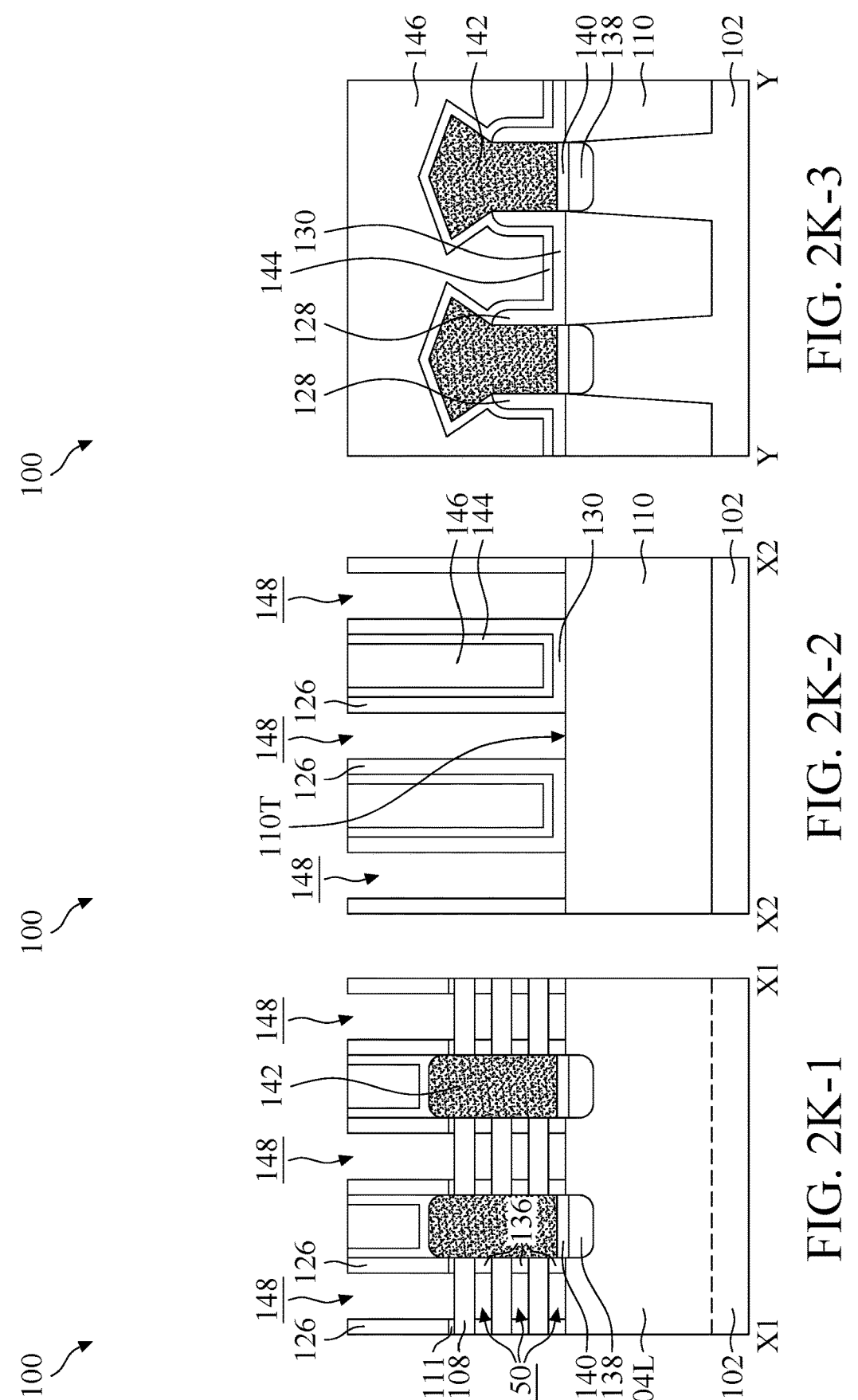

The dummy gate structures 112 and the semiconductor capping layer 111 are removed using an etching process to form gate trenches 148 between the gate spacers 126, as shown in FIGS. 2K-1 and 2K-2, in accordance with some embodiments. In some embodiments, the gate trenches 148 expose the channel regions of the active regions 104 and the top surface 110T of the isolation structure 110. In some embodiments, the gate trenches 148 further expose sidewalls of the gate spacers 126 facing the channel region. In some embodiments, the etching process includes one or more etching processes. For example, when the dummy gate electrode layer 116 is made of polysilicon, a wet etchant such as a tetramethylammonium hydroxide (TMAH) solution may be used to selectively remove the dummy gate electrode layer 116. For example, the dummy gate dielectric layer 114 may be thereafter removed using a plasma dry etching, a dry chemical etching, and/or a wet etching.

Afterward, an etching process is performed on the first semiconductor layers 106 of the active regions 104 to form gaps 150, as shown in FIG. 2K-1, in accordance with some embodiments. The inner spacers 136 may be used as an etching stop layer in the etching process, which may protect the source/drain features 142 from being damaged. In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

The gaps 150 are formed between adjacent second semiconductor layers 108 and between the lowermost second semiconductor layer 108 and the lower fin element 104L, in accordance with some embodiments. In some embodiments, the gaps 150 also expose the sidewalls of the inner spacers 136 facing the channel region.

After the one or more etching processes, the four main surfaces of the second semiconductor layers 108 are exposed, in accordance with some embodiments. The exposed second semiconductor layers 108 form nanostructures, in accordance with some embodiments. The nanostructures 108 are vertically stacked and spaced apart from one other, in accordance with some embodiments. As the term is used herein, "nanostructures" refers to the semiconductor layers with cylindrical shape, bar shaped and/or sheet shape. The nanostructures 108 function as channels of the resulting semiconductor devices (e.g., nanostructure transistors such as GAA transistors), in accordance with some embodiments.

FIGS. 2L-1 to 2L-3 illustrate a semiconductor structure 100 after the formation of final gate stacks 152, in accordance with some embodiments. FIGS. 2L-4 and 2L-5 are plan views illustrating the semiconductor structure 100 respectively taken along plan A-A and plan B-B shown in FIGS. 2L-1 and 2L-3, in accordance with some embodiments.

Final gate stacks 152 are formed in the gate trenches 148 and gaps 150. They are thereby wrapped around the nanostructures 108, as shown in FIGS. 2K-1, 2K-2 and 2K-3 and 2K-4, in accordance with some embodiments. In some embodiments, the final gate stacks 152 extend in the Y direction. The final gate stacks 152 have longitudinal axes parallel to the Y direction, in accordance with some embodiments. That is, the dimensions (lengths) of the final gate stacks 152 in the Y direction are greater than the dimensions (widths) of the final gate stacks 152 in the X direction.

Figures 1, 2, 2L, 3:
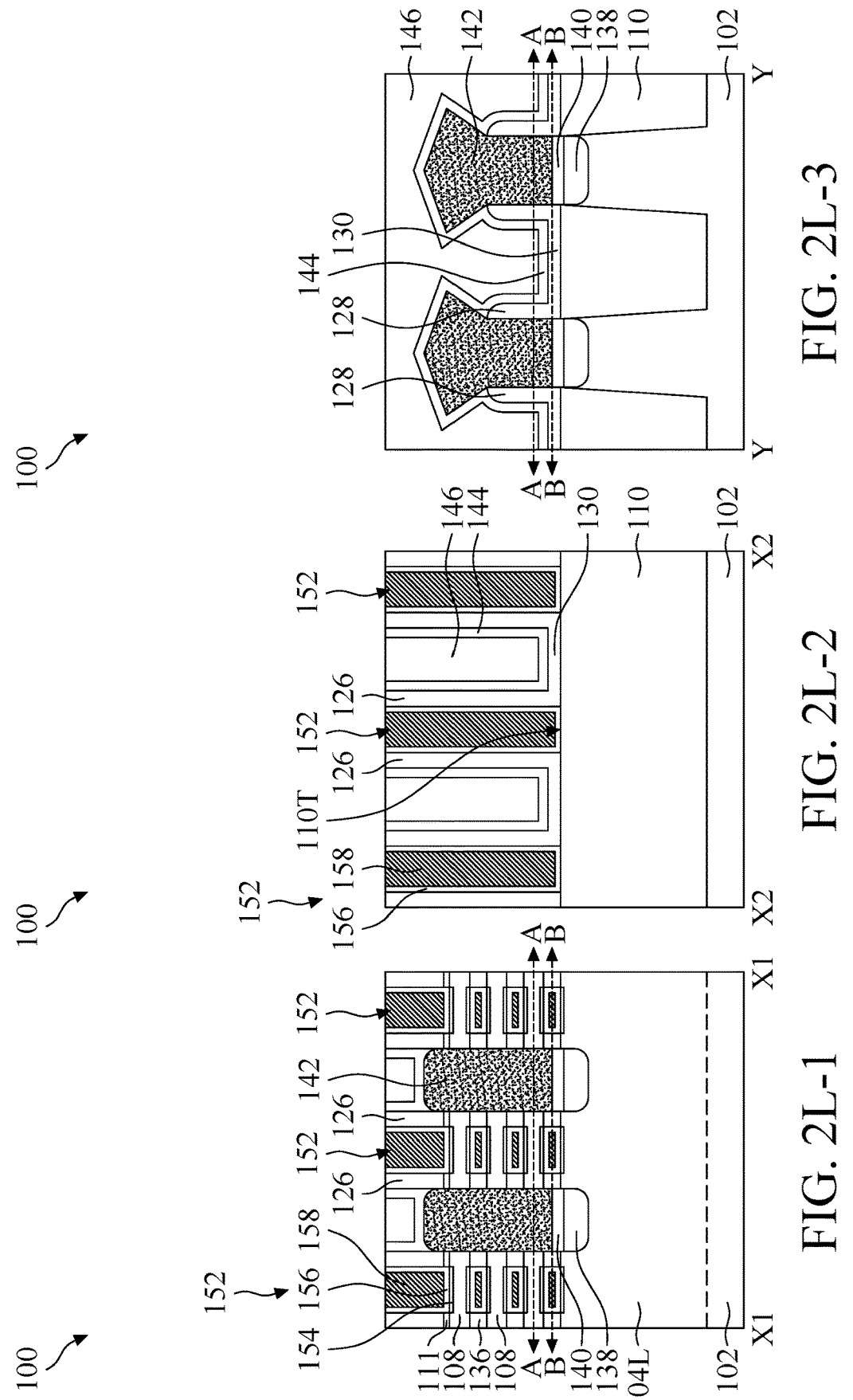
Figures 2, 2L, 3, 4, 5:
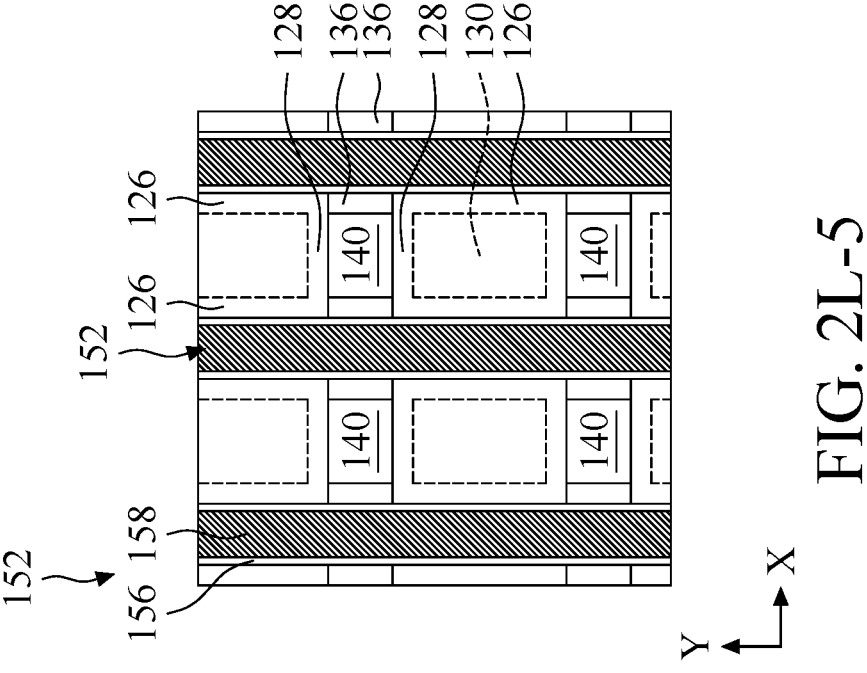
Figures 2, 2L, 3, 4:
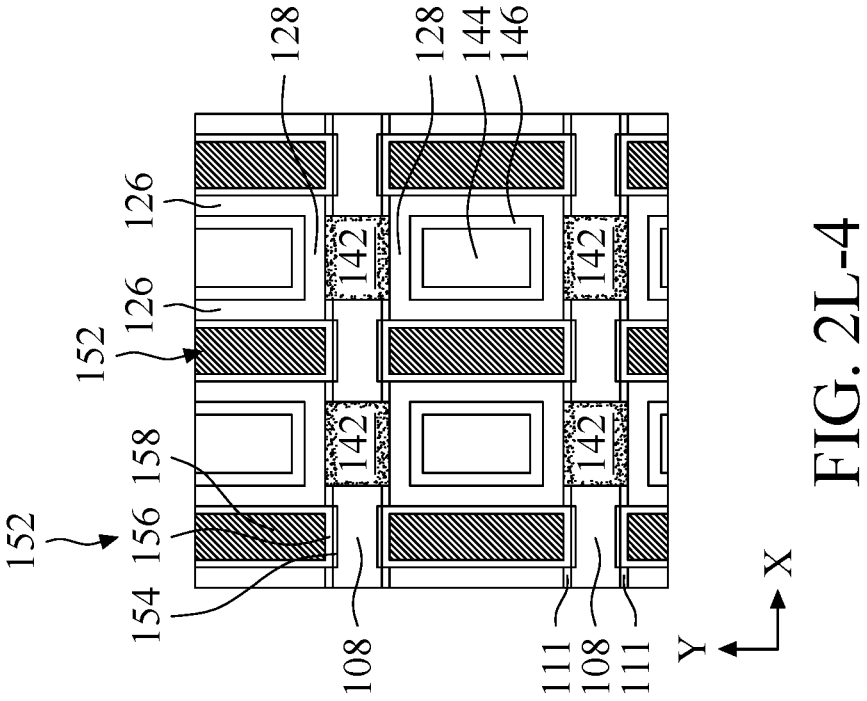

The final gate stacks 152 engage the channel region so that current can flow between the source/drain features 142 during operation. In some embodiments, each of the final gate stacks 152 includes an interfacial layer 154, a gate dielectric layer 156 and a metal gate electrode layer 158, as shown in FIGS. 2L-1 and 2L-2, in accordance with some embodiments.

The interfacial layer 154 is formed on the exposed surfaces of the nanostructures 108 and the exposed top surfaces of the lower fin elements 104L, in accordance with some embodiments. The interfacial layer 154 wraps around the nanostructures 108, in accordance with some embodiments. In some embodiments, the interfacial layer 154 is made of a chemically formed silicon oxide. In some embodiments, the interfacial layer 154 is nitrogen-doped silicon oxide. In some embodiments, the interfacial layer 154 is formed using one or more cleaning processes such as including ozone ($O_3$), ammonia hydroxide-hydrogen peroxide-water mixture, and/or hydrochloric acid-hydrogen peroxide-water mixture. Semiconductor material from the nanostructures 108 and the lower fin elements 104L is oxidized to form the interfacial layer 154, in accordance with some embodiments.

The gate dielectric layer 156 is formed conformally along the interfacial layer 154 to wrap around the nanostructures 108, in accordance with some embodiments. The gate dielectric layer 156 is also conformally formed along the sidewalls of the gate spacers 126 facing the channel region, in accordance with some embodiments. The gate dielectric layer 156 is also conformally formed along the sidewalls of the inner spacers 136 facing the channel region, in accordance with some embodiments. The gate dielectric layer 156 is further formed along the top surface 110T of the isolation structure 110, in accordance with some embodiments.

The gate dielectric layer 156 may be high-k dielectric layer. In some embodiments, the high-k dielectric layer is dielectric material with high dielectric constant (k value), for example, greater than 9, such as greater than 13. In some embodiments, the high-k dielectric layer includes hafnium oxide ($HfO_2$), $TiO_2$, $HfZrO$, $Ta_2O_3$, $HfSiO_4$, $ZrO_2$, $ZrSiO_2$, $LaO$, $Al_2O_3$, $ZrO$, $TiO$, $Ta_2O_5$, $Y_2O_3$, $SrTiO_3$ (STO), $BaTiO_3$ (BTO), $BaZrO$, $HfZrO$, $HfLaO$, $HfSiO$, $LaSiO$, $AlSiO$, $HfTaO$, $HfTiO$, (Ba, Sr) $TiO_3$ (BST), $Si_3N_4$, oxynitrides (SiON), a combination thereof, or another suitable material. The high-k dielectric layer may be deposited using ALD, PVD, CVD, and/or another suitable technique.

The metal gate electrode layer 158 is formed to overfill remainders of the gate trenches 148 and gaps 150, in accordance with some embodiments. In some embodiments, the metal gate electrode layer 158 is made of more than one conductive material, such as a metal, metal alloy, conductive metal oxide and/or metal nitride, another suitable conductive material, and/or a combination thereof. For example, the metal gate electrode layer 158 may be made of Ti, Ag, Al, TiAlN, TaC, TaCN, TaSiN, Mn, Zr, TiN, TaN, Ru, Mo, WN, Cu, W, Re, Ir, Co, Ni, another suitable conductive material, or multilayers thereof.

The metal gate electrode layer 158 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer. The metal gate electrode layer 158 may be formed using ALD, PVD, CVD, e-beam evaporation, or another suitable technique.

A planarization process such as CMP may be performed on the semiconductor structure 100 to remove the materials of the gate dielectric layer 156 and the metal gate electrode layer 158 formed above the top surface of the interlayer dielectric layer 146, in accordance with some embodiments. The final gate stacks 152 that are wrapped around the nanostructures 108 combine with the neighboring source/drain features 142 to form nanostructure transistors, e.g., n-channel nanostructure transistors and p-channel nanostructure transistors.

It should be understood that the semiconductor structure 100 may undergo further CMOS processes to form various features over the semiconductor structure, such as a multilayer interconnect structure (e.g., contact plugs to final gate stacks and/or to source/drain features, conductive vias, metal lines, inter metal dielectric layers, passivation layers, etc.).

Figures 1, 2, 3, 3A:
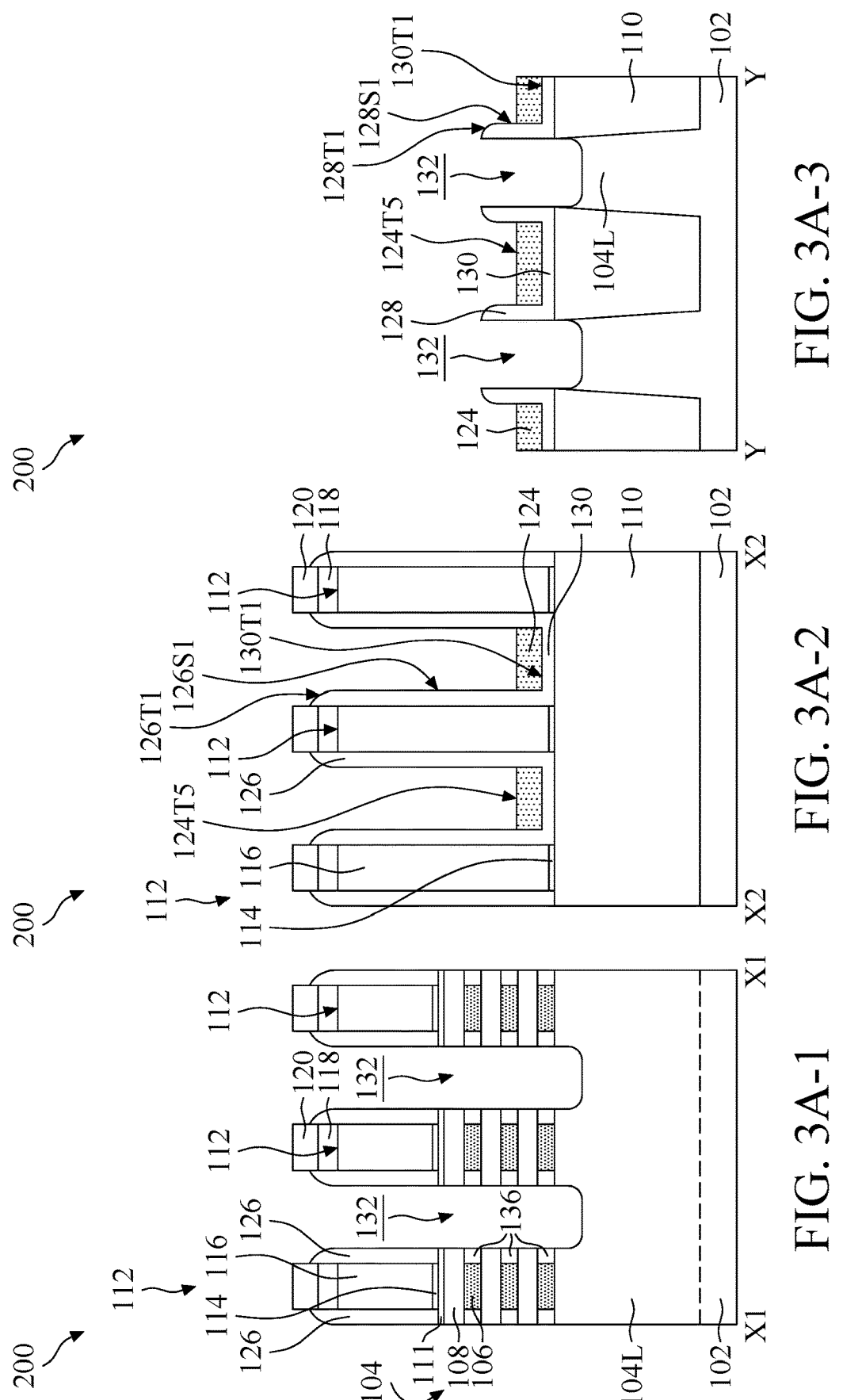
Figures 1, 2, 3, 3B:
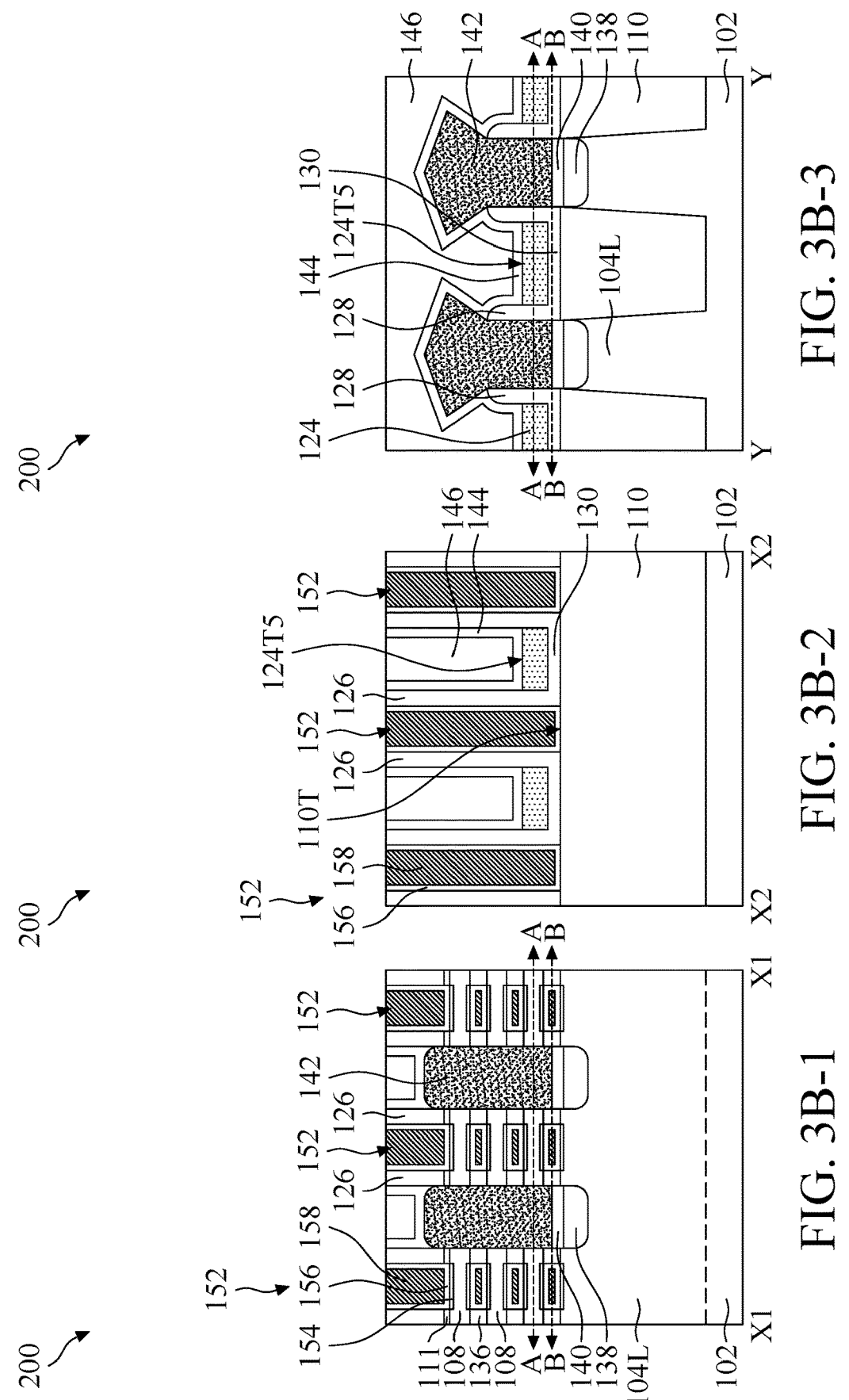
Figures 3, 3B, 4, 5:
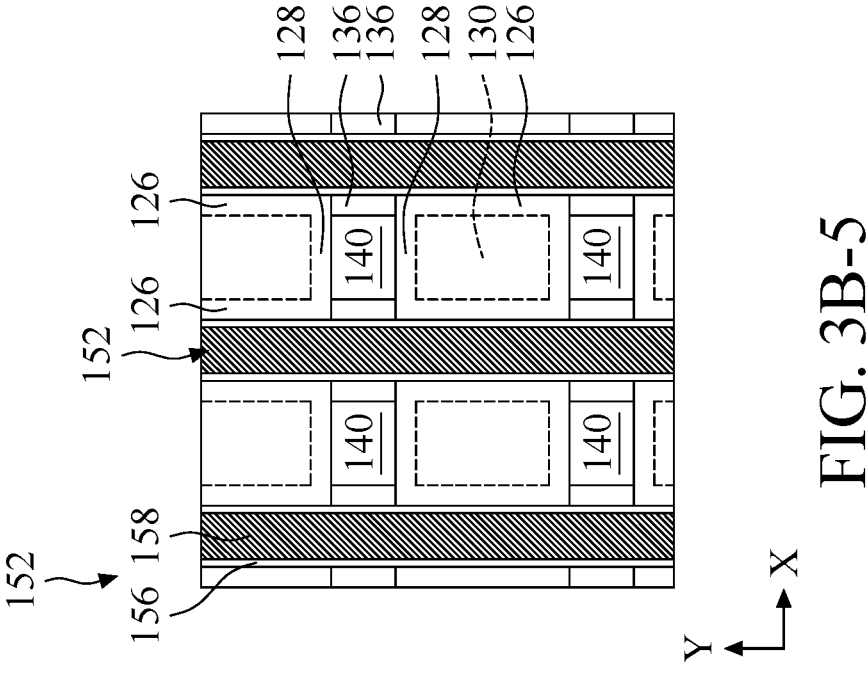
Figures 3, 3B, 4:
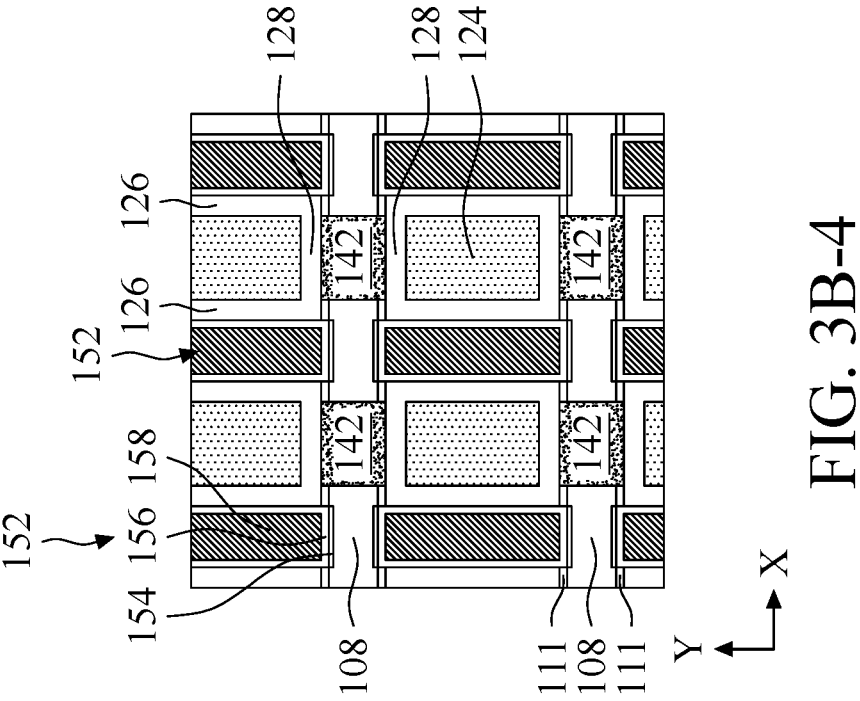

FIGS. 3A-1 through 3B-3 are cross-sectional views illustrating the formation of a semiconductor structure 200 at various intermediate stages, in which FIGS. 3A-1 and 3B-1 correspond to cross-section X1-X1 shown in FIG. 1, FIGS. 3A-2 and 3B-2 correspond to cross-section X2-X2 shown in FIG. 1, and FIGS. 3A-3 and 3B-3 correspond to cross-section Y-Y shown in FIG. 1, in accordance with some embodiments of the disclosure. The embodiments of FIGS. 3A-1 through 3B-3 are similar to the embodiments of FIGS. 2A-1 to 2L-3 except that the sacrificial material 124 is not completely removed in the etching processes.

FIGS. 3A-1 to 3A-3 illustrate a semiconductor structure 200 after the formation of inner spacers 136, in accordance with some embodiments. After going through the etching processes described in FIGS. 2E-1 to 2H-3, the sacrificial material 124 left remaining on the protection layers 130, as shown in FIGS. 3A-2 and 3A-3, in accordance with some embodiments. The sacrificial material 124 has a top surface 124T5 that is substantially flat (e.g., linear). In some embodiments, in a cross-sectional view (e.g., FIG. 3A-2 or 3A-3), the top surface 124T5 continuously extends in the horizontal direction (e.g., the X direction or the Y direction) from one gate spacer 126 to another gate spacer 126 or from one fin spacer 128 to another fin spacer 128.

FIGS. 3B-1 to 3B-3 illustrate a semiconductor structure 200 after the formation of final gate stacks 152, in accordance with some embodiments. FIGS. 3B-4 and 3B-5 are plan views illustrating the semiconductor structure 200 respectively taken along plan A-A and plan B-B shown in FIGS. 3B-1 and 3B-3, in accordance with some embodiments. The steps described above in FIGS. 2I-1 to 2L-3 are performed on the semiconductor structure 200, thereby forming the source/drain features 142, the contact etching stop layer 144, the interlayer dielectric layer 146, and the final gate stacks 152, as shown in FIGS. 3B-1 to 3B-5, in accordance with some embodiments.

In some embodiments, the contact etching stop layer 144 is formed on the top surface 124T5 of the sacrificial material 124 and is separated from the protection layer 130. In FIG. 3B-4, the gate spacers 126 and the fin spacers 138 together form a closed-loop profile, and the sacrificial material 124 is located within the closed-loop profile, in accordance with some embodiments.

Figures 1, 2, 3, 4A:
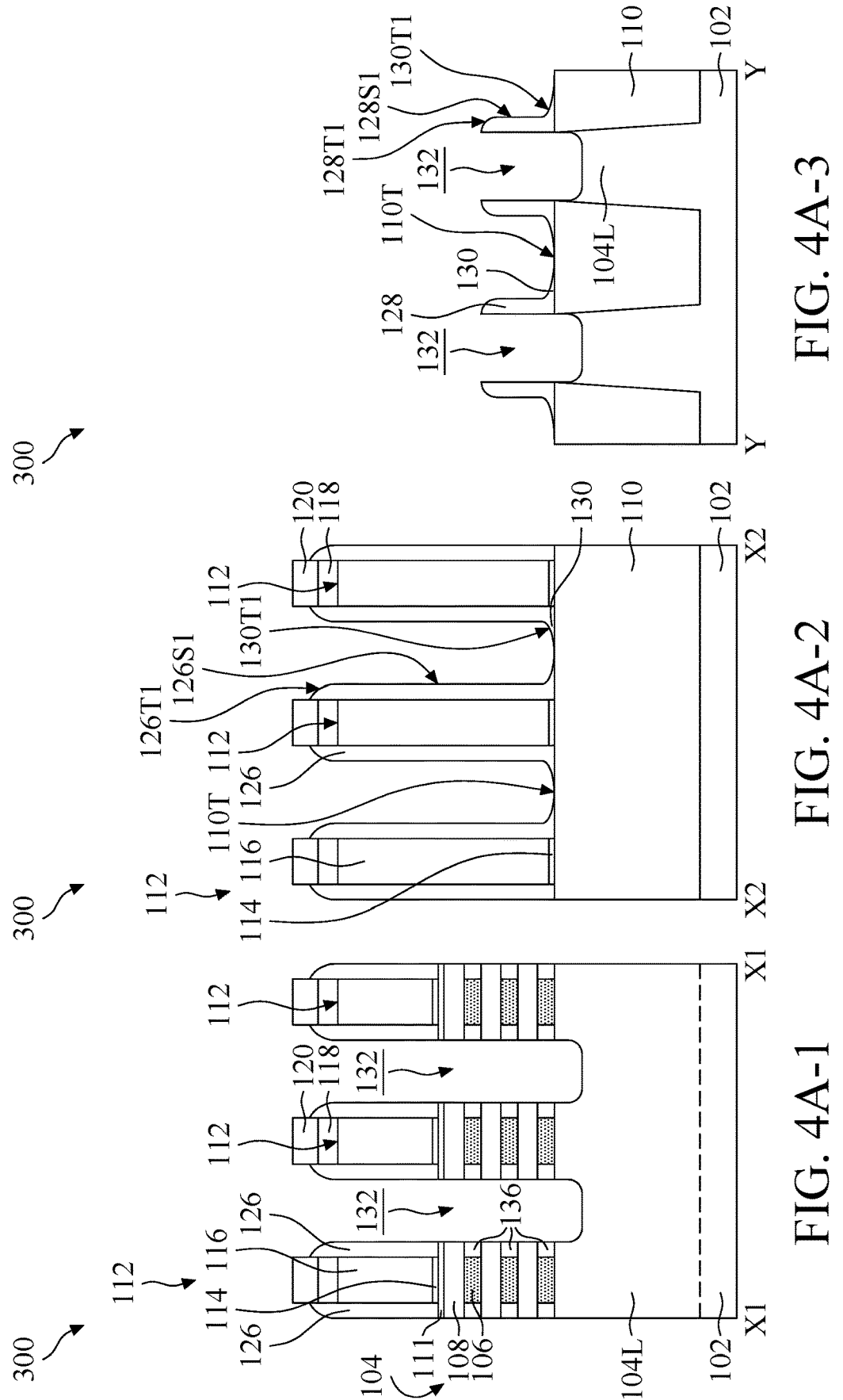
Figures 1, 2, 3, 4B:
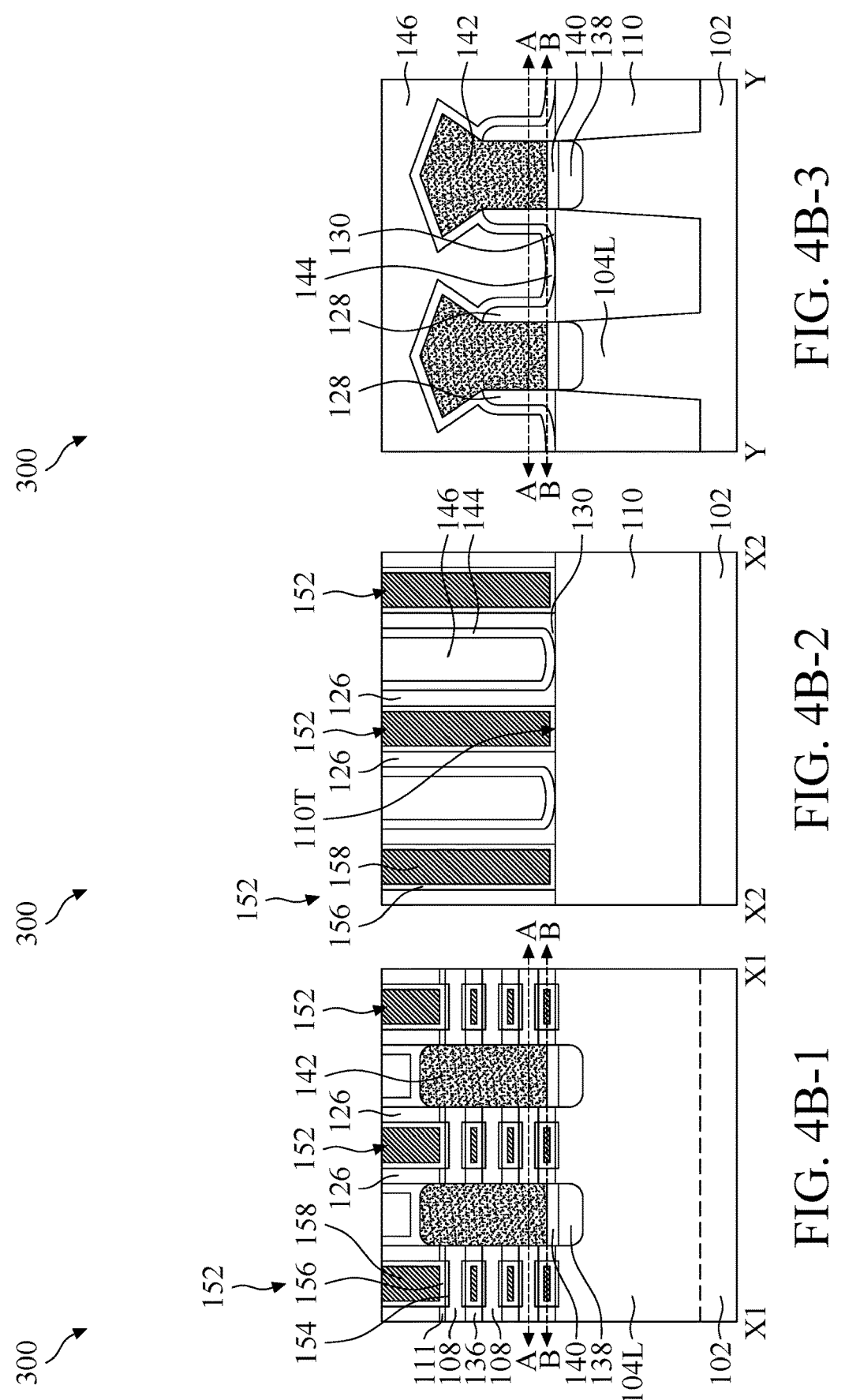
Figures 4, 4B, 5:
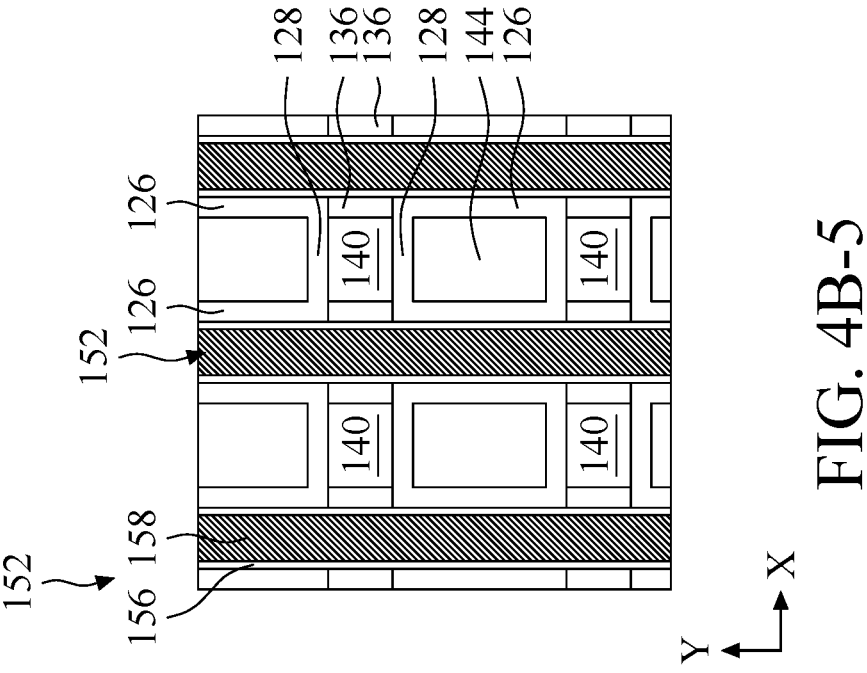
Figures 4, 4B:
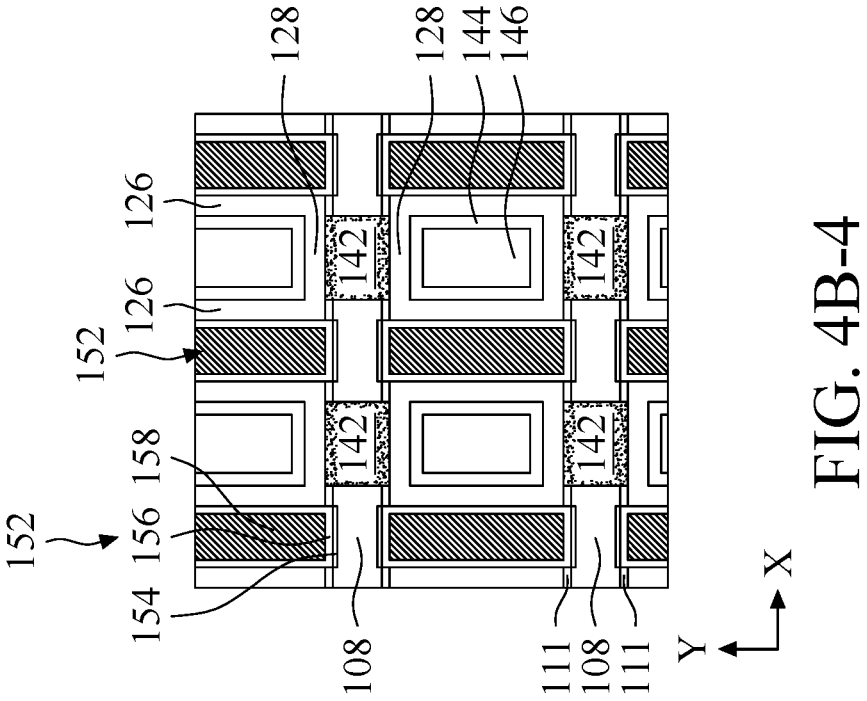
Figures 1, 2, 3, 5:
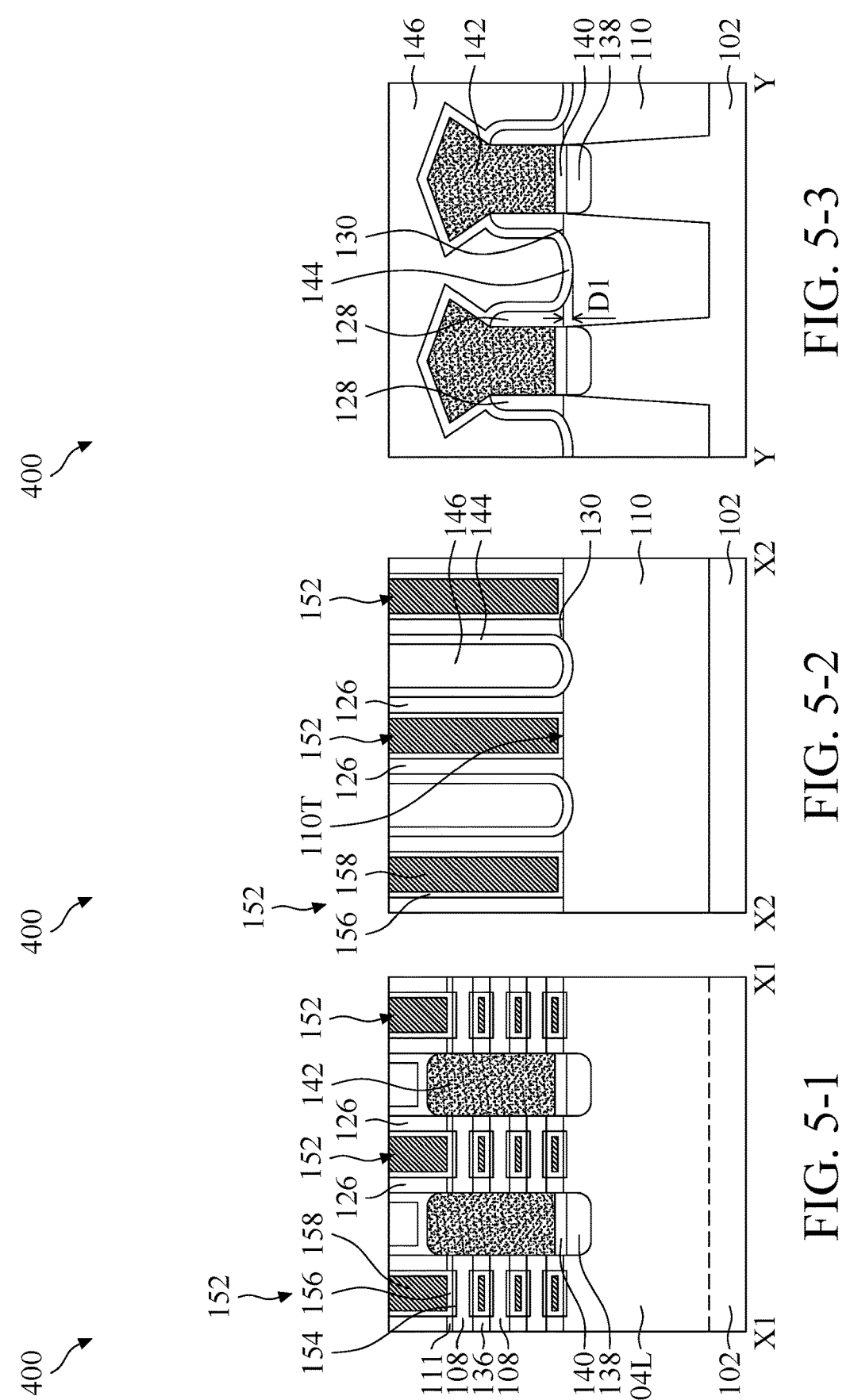

FIGS. 4A-1 through 4B-3 are cross-sectional views illustrating the formation of a semiconductor structure 300 at various intermediate stages, in which FIGS. 4A-1 and 4B-1 correspond to cross-section X1-X1 shown in FIG. 1, FIGS. 4A-2 and 4B-2 correspond to cross-section X2-X2 shown in FIG. 1, and FIGS. 4A-3 and 4B-3 correspond to cross-section Y-Y shown in FIG. 1, in accordance with some embodiments of the disclosure. The embodiments of FIGS. 4A-1 through 4B-3 are similar to the embodiments of FIGS. 2A-1 to 2L-3 except that the protection layers 130 are opened to expose the isolation structure 110.

FIGS. 4A-1 to 4A-3 illustrate a semiconductor structure 300 after the formation of inner spacers 136, in accordance with some embodiments. After going through the etching processes described in FIGS. 2E-1 to 2H-3, the sacrificial material 124 is completely consumed and the protection layers 130 are recessed to partially expose the top surface 110T of the isolation structure 110, e.g., the top surface 110t is exposed at the central position between neighboring active regions 104, in accordance with some embodiments.

In some embodiments, the protection layers 130 protrude from the sidewall 128S1 of the fin spacers 128 (and from the sidewall 126S1 of the gate spacers 126) and are tapered toward the central position between neighboring active regions 104 where the isolation structure 110 is exposed. In some embodiments, the protection layers 130 have top surfaces 130T1 that are curve surfaces. In some embodiments, the top surfaces 130T1 are jointed with the sidewall 128S1 of the fin spacers 128 (and the sidewall 126S1 of the gate spacers 126) and the top surface 110T of the isolation structure 110.

In the embodiments of the present disclosure, by forming the sacrificial material 124 and the protection layers 130 to prevent the isolation structure 110 from being seriously recessed, the risk that the dummy gate structures 112 will collapse may decrease. Furthermore, the risk of exposing the lower fin elements 104L of the active regions 104 may decrease, thereby preventing the merging of the source/drain features 142. Therefore, the reliability, manufacturing yield and performance of the resulting semiconductor structure may increase.

FIGS. 4B-1 to 4B-3 illustrate a semiconductor structure 300 after the formation of final gate stacks 152, in accordance with some embodiments. FIGS. 4B-4 and 4B-5 are plan views illustrating the semiconductor structure 300 respectively taken along plan A-A and plan B-B shown in FIGS. 3B-1 and 3B-3, in accordance with some embodiments. The steps described above in FIGS. 2I-1 to 2L-3 are performed on the semiconductor structure 300, thereby forming the source/drain features 142, the contact etching stop layer 144, the interlayer dielectric layer 146, and the final gate stacks 152, as shown in FIGS. 4B-1 to 4B-5, in accordance with some embodiments.

In some embodiments, the contact etching stop layer 144 is in contact with the protection layer 130 and the isolation structure 110. In FIG. 4B-5, the gate spacers 126 and the fin spacers 138 together form a closed-loop profile, and the contact etching stop layer 144 is located within the closed-loop profile, in accordance with some embodiments.

FIGS. 5-1 to 5-3 are a modification of the semiconductor structure 300 of FIGS. 4B-1 to 4B-3, in accordance with some embodiments of the disclosure. FIGS. 5-1 to 5-3 illustrate a semiconductor structure 400 that is similar to the semiconductor structure 300 of FIGS. 4B-1 to 4B-3 except that the isolation structure 110 is recessed, in accordance with some embodiments. After the etching process for forming the inner spacers 136, the protection layers 130 are break through to expose the isolation structure 110, and the isolation structure 110 is recessed to a depth D1. In some embodiments, the recess in the isolation structure 110 is shallower than the source/drain recess 132 (FIGS. 2H-2 and 2H-3). Therefore, by forming the sacrificial material 124 and the protection layers 130 to prevent the isolation structure 110 from being seriously recessed, the risk that the dummy gate structures 112 collapse and the risk that the lower fin elements 104L of the active regions 104 are exposed may decrease.

FIGS. 6A-1 to 6C-3 are cross-sectional views illustrating the formation of a semiconductor structure 500 at various intermediate stages, in which FIGS. 6A-1, 6B-1 and 6C-1 correspond to cross-section X1-X1 shown in FIG. 1, FIGS. 6A-2, 6B-2 and 6C-2 correspond to cross-section X2-X2 shown in FIG. 1, and FIGS. 6A-3, 6B-3 and 6C-3 correspond to cross-section Y-Y shown in FIG. 1, in accordance with some embodiments of the disclosure. The embodiments of FIGS. 6A-1 to 6C-3 are similar to the embodiments of FIGS. 2A-1 to 2L-3 except that the spacer layer 122 is a dual-layer structure.

Figures 1, 2, 3, 6A:
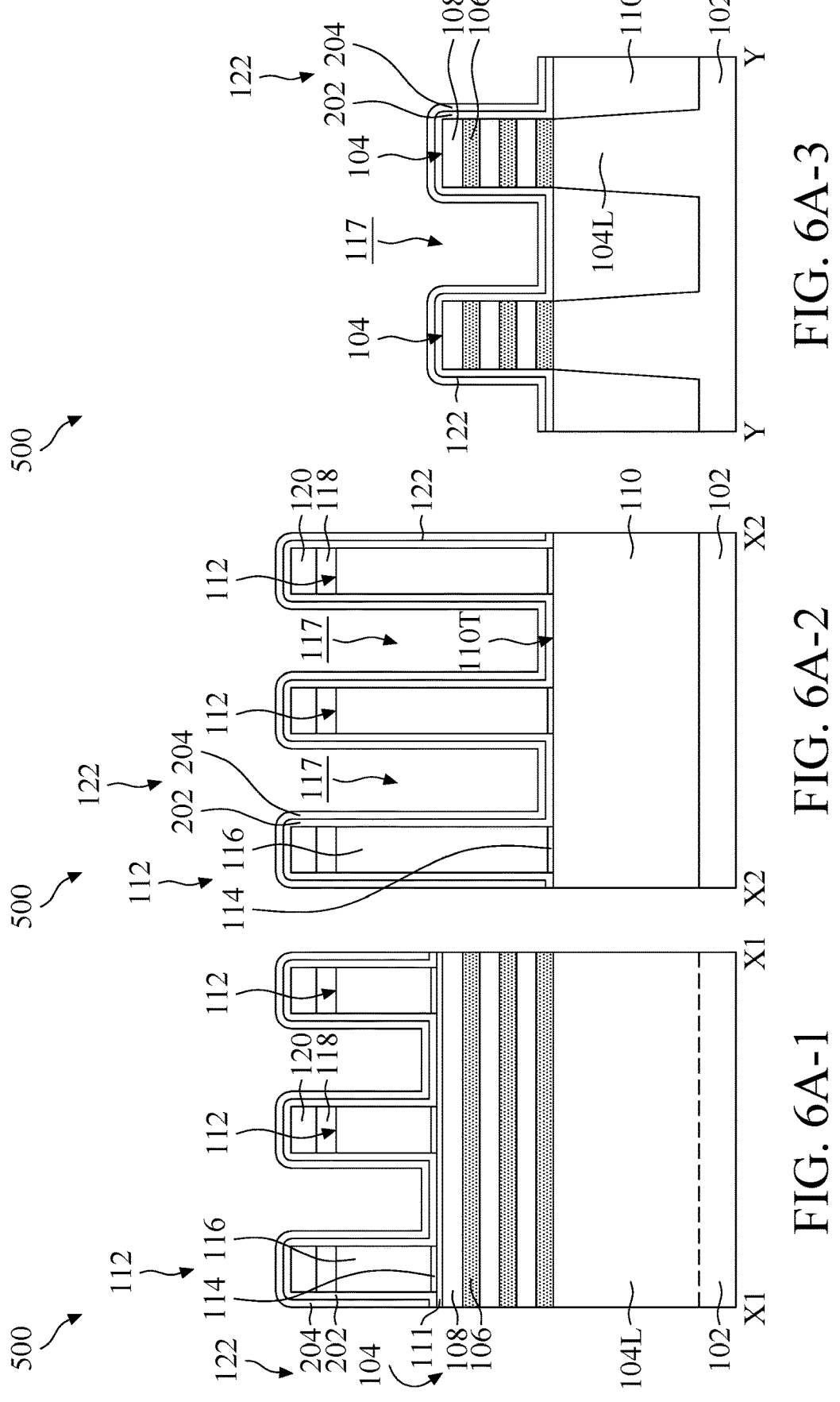

FIGS. 6A-1 to 6A-3 illustrate a semiconductor structure 500 after the formation of a spacer layer 122, in accordance with some embodiments. Spacer layer 122 is formed over the semiconductor structure 500, as shown in FIGS. 6A-1 to 6A-3, in accordance with some embodiments. In some embodiments, the spacer layer 122 includes a first dielectric material 202 and a second dielectric material 204 formed over the first dielectric layer 202.

In some embodiments, the first dielectric material 202 and the second dielectric material 204 are made of different materials and have different dielectric constant values. For example, the first dielectric material 202 is a SiOCN layer and the second dielectric material 204 is a Si(O)CN layer. The oxygen concentration in the SiOCN layer may be greater than the oxygen concentration in the Si(O)CN layer. In some embodiments, the first dielectric material 202 has a thickness in a range from about 10 Å to about 60 Å. In some embodiments, the second dielectric material 204 has a thickness in a range from about 15 Å to about 90 Å.

Figures 1, 2, 3, 6B:
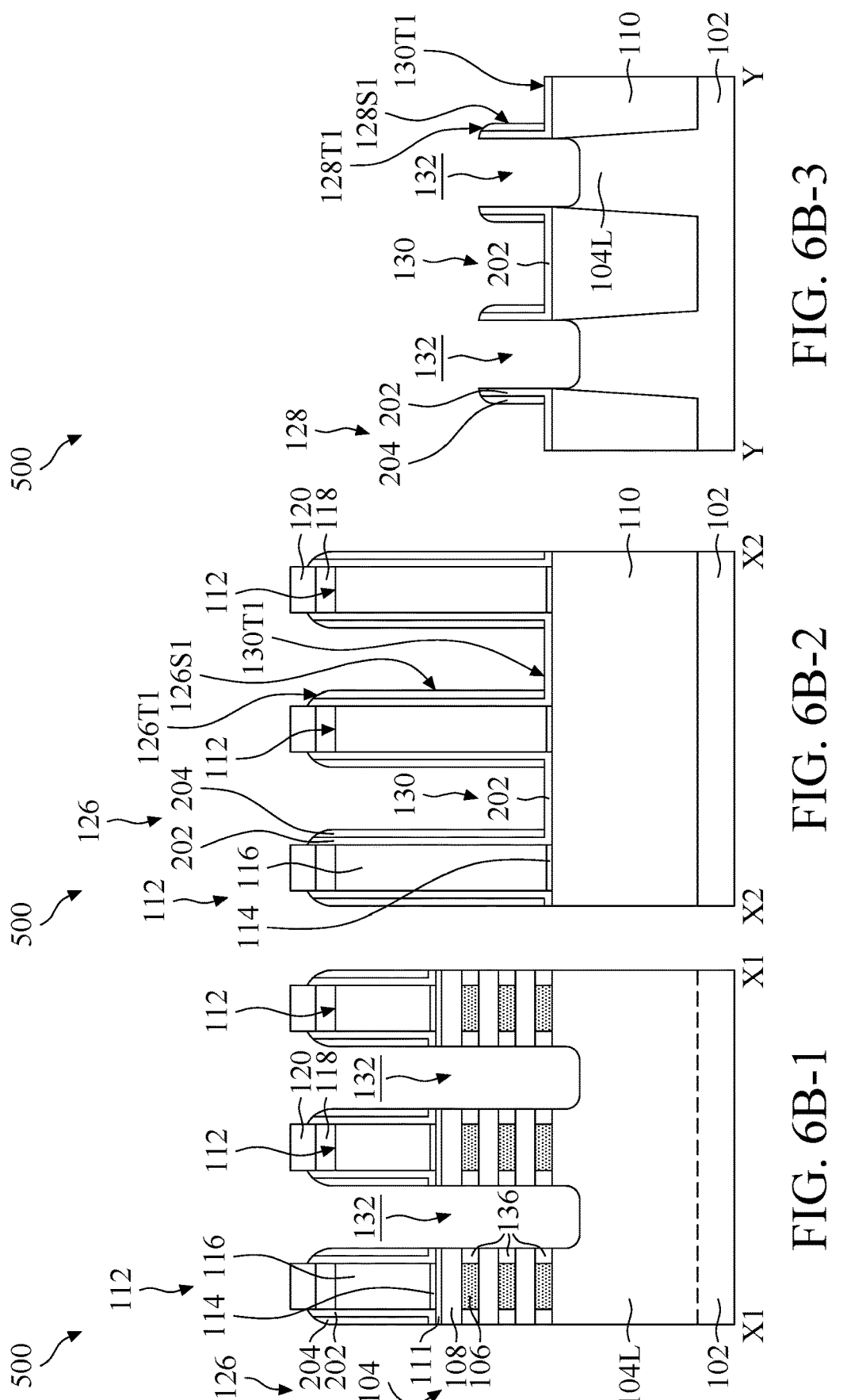

FIGS. 6B-1 to 6B-3 illustrate a semiconductor structure 500 after the formation of inner spacers 136, in accordance with some embodiments. The steps described above in FIGS. 2C-1 to 2H-3 are performed on the semiconductor structure 600, thereby forming the gate spacers 126, the fin spacers 128, the protection layers 130, the source/drain recess 132 and the inner spacers 136, as shown in FIGS. 6B-1 to 6B-3, in accordance with some embodiments. Each of the gate spacers 126 and the fin spacers 128 includes the first dielectric material 202 and the second dielectric material 204, in accordance with some embodiments. After going through the etching processes described in FIGS. 2E-1 to 2H-3, the sacrificial material 124 is completely consumed and the second dielectric material 204 of the protection layers 130 is removed, in accordance with some embodiments. In some embodiments, the first dielectric material 202 of the protection layers 130 is exposed.

Figures 1, 2, 3, 6C:
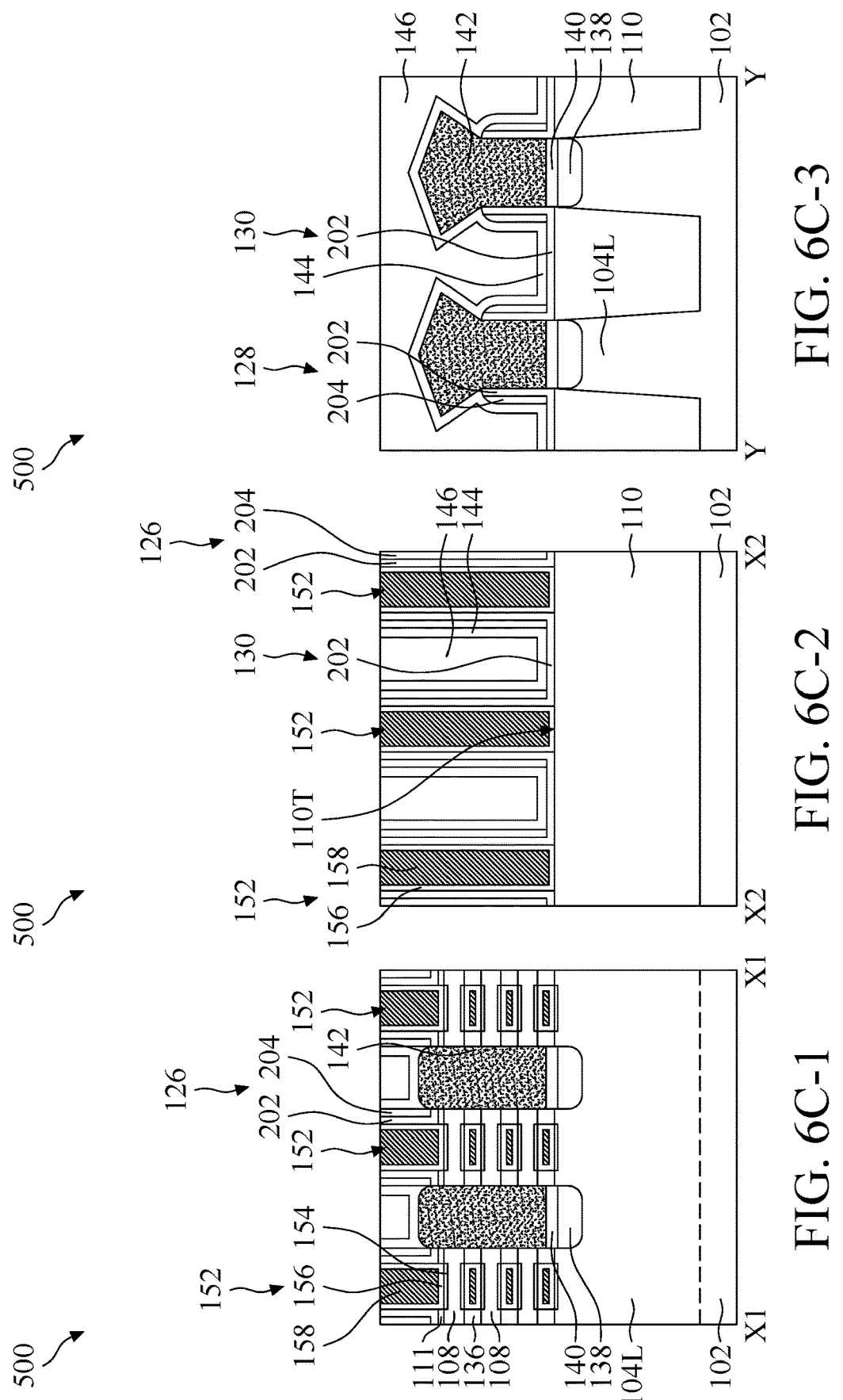

FIGS. 6C-1 to 6C-3 illustrate a semiconductor structure 500 after the formation of final gate stacks 152, in accordance with some embodiments. The steps described above in FIGS. 2I-1 to 2L-3 are performed on the semiconductor structure 500, thereby forming the source/drain features 142, the contact etching stop layer 144, the interlayer dielectric layer 146, and the final gate stacks 152, as shown in FIGS. 6C-1 to 6C-3, in accordance with some embodiments. In some embodiments, the contact etching stop layer 144 is in contact with the second dielectric material 204 of the gate spacers 126 and the second dielectric material 204 of the fin spacers 128 and the first dielectric material 202 of the protection layer 120.

Figures 1, 2, 3, 7:
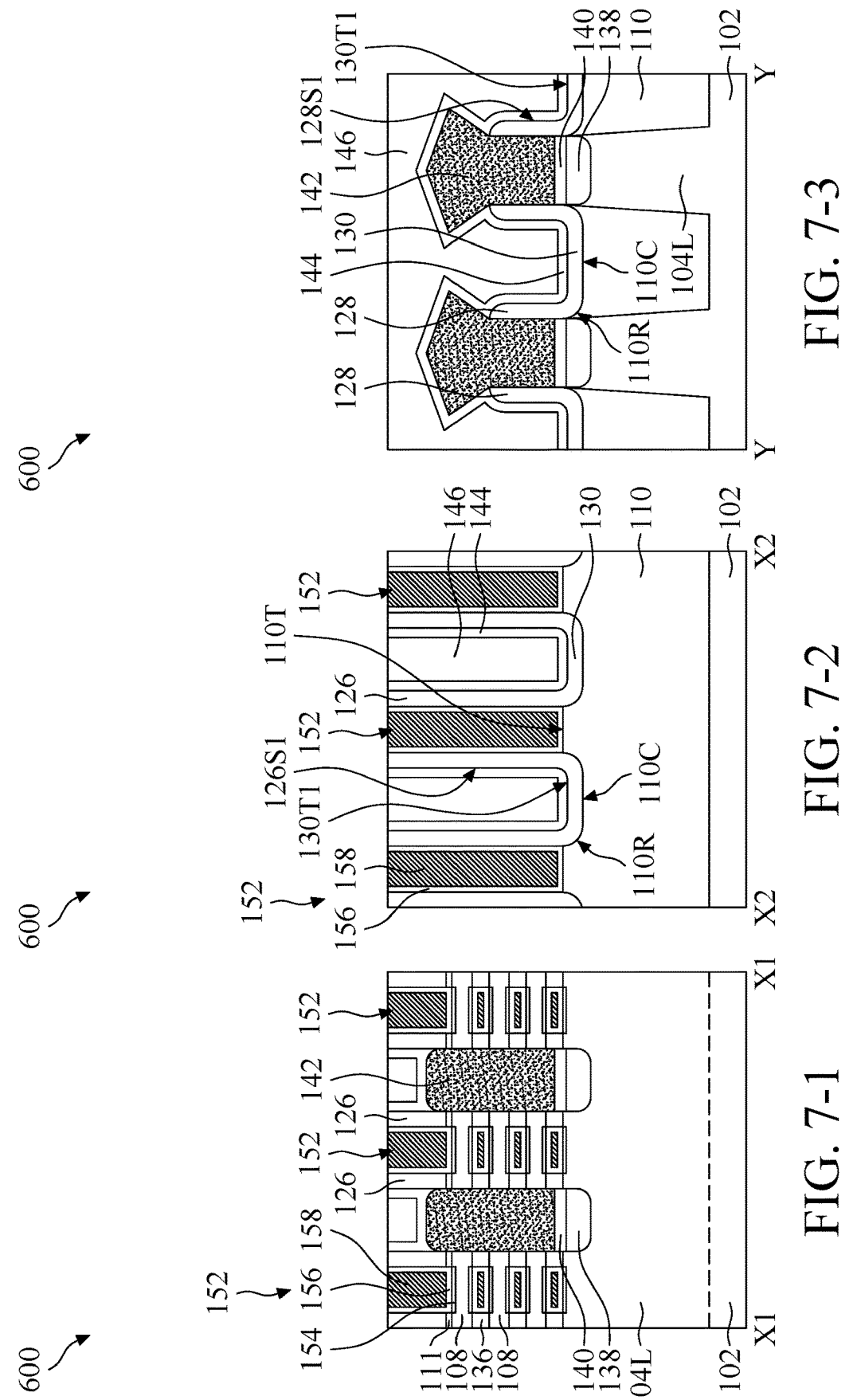

FIGS. 7-1 to 7-3 are a modification of the semiconductor structure 100 of FIGS. 2L-1 to 2L-3, in accordance with some embodiments of the disclosure. FIGS. 7-1 to 7-3 illustrate a semiconductor structure 600 that is similar to the semiconductor structure 100 of FIGS. 2L-1 to 2L-3 except that the top surface 110T of the isolation structure 110 has concave portions, in accordance with some embodiments.

Due to the characteristics of the etching processes for forming the isolation structure 110 and the dummy gate structures 112, the concave top surface 110T of the isolation structure 110 has concave portions 110C and rounding portions 110R, in accordance with some embodiments. In some embodiments, the lowest points of the concave portions 110C are located at a lower position than the top surfaces of the lower fin elements 104L and the bottom surfaces of the dummy gate structures 112, in accordance with some embodiments. The spacer layer 122 is formed to conform the profile of the top surface 110T of the isolation structure 110, and thus the sidewalls 126S1 of the gate spacers 126 meet with the top surfaces 130T1 of the protection layers 130 at rounding corners, in accordance with some embodiments. Similarly, the sidewalls 128S1 of the fin spacers 128 meet with the top surfaces 130T1 of the protection layers 130 at rounding corners, in accordance with some embodiments.

As described above, the method for forming the semiconductor structure includes forming the sacrificial material 124 and the protection layers 130 over the isolation structure 110, thereby preventing the isolation structure 110 from being seriously recessed in several etching processes, especially in the etching processes for forming the gate spacers 126 and the fin spacers 128 and for forming the source/drain recesses 132. As a result, the risk that the dummy gate structures 112 collapse may decrease. Furthermore, the risk of exposing the lower fin elements 104L of the active regions 104 may decrease, thereby preventing the merging of the source/drain features 142. Therefore, the reliability, manufacturing yield and performance of the resulting semiconductor structure may increase.

Embodiments of a semiconductor structure and the method for forming the same may be provided. The method for forming the semiconductor structure includes forming a spacer layer along dummy gate structures, active regions and an isolation structure, and forming a sacrificial material over the spacer layer. The sacrificial material and the protection layer may protect the underlying isolation structure from being recessed in the etching processes. As a result, the risk that the dummy gate structures collapse and the risk that the active regions are exposed may decrease. Therefore, the reliability, manufacturing yield and performance of the resulting semiconductor structure may increase.

In some embodiments, a method for forming a semiconductor structure is provided. The method includes forming active regions over a substrate, forming an isolation structure to surround lower portions of the active regions, forming dummy gate structures across the active regions and the isolation structure, forming a spacer layer along the dummy gate structures, the active regions and the isolation structure to partially fill a space defined by the active regions and the dummy gate structures, forming a sacrificial material over the spacer layer to overfill a remainder of the space, recessing the sacrificial material to expose the spacer layer, etching the spacer layer to expose the active region, etching the active region to form a recess, and forming a source/drain feature in the source/drain recess.

In some embodiments, a method for forming a semiconductor structure is provided. The method includes forming an active region over a substrate. The active region includes a lower fin element and an epitaxial stack over the lower fin element. The method also includes forming an isolation structure adjacent to the lower fin element, forming a spacer layer above the epitaxial stack and the isolation structure, forming a sacrificial material on a first portion of the spacer layer directly above the isolation structure, removing a second portion of the spacer layer directly above the active region while the first portion of the spacer layer directly above the isolation structure remains unetched, patterning the epitaxial stack to form a set of nanostructures, and forming a gate stack to surround the set of nanostructures.

In some embodiments, a semiconductor structure is provided. The semiconductor structure includes a first source/drain feature, an isolation structure, a first fin spacer, a protection layer, and a contact etching stop layer. The first source/drain feature is located over the first fin element. The isolation structure surrounds the first fin element. The first fin spacer is disposed along a sidewall of the first source/drain feature. The protection layer is disposed along a top surface of the isolation structure. The first fin spacer and the protection layer are made of a continuous dielectric material. The contact etching stop layer is located over the protection layer and the first fin spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming active regions over a substrate;
   forming an isolation structure to surround lower portions of the active regions;
   forming dummy gate structures across the active regions and the isolation structure;
   forming a spacer layer along the dummy gate structures, the active regions and the isolation structure to partially fill a space defined by the active regions and the dummy gate structures;
   forming a sacrificial material over the spacer layer to overfill a remainder of the space;
   recessing the sacrificial material to expose the spacer layer;
   etching the spacer layer to expose the active regions;
   etching the active regions to form recesses; and
   forming source/drain features in the recesses.

2. The method for forming the semiconductor structure as claimed in claim 1, wherein the sacrificial material protects the isolation structure from being etched when etching the spacer layer to expose the active regions.

3. The method for forming the semiconductor structure as claimed in claim 1, wherein after etching the spacer layer to expose the active regions, a first vertical portion of the spacer layer remaining on sidewalls of the dummy gate structures forms gate spacers, a second vertical portion of the spacer layer remaining on sidewalls of the active regions forms fin spacers, and a horizontal portion of the spacer layer remaining on a top surface of the isolation structure form a protection layer.

4. The method for forming the semiconductor structure as claimed in claim 3, further comprising:
    removing the sacrificial material to expose the protection layer after etching the active regions to form the recesses.

5. The method for forming the semiconductor structure as claimed in claim 3, wherein the protection layer has a top surface that continuously extends in a horizontal direction from a first fin spacer to a second fin spacer.

6. The method for forming the semiconductor structure as claimed in claim 3, wherein the protection layer has a first thickness along the top surface of the isolation structure, the gate spacers have a second thickness along the sidewalls of the dummy gate structures, and after forming the source/drain features in the recesses, the first thickness is thinner than the second thickness.

7. The method for forming the semiconductor structure as claimed in claim 3, further comprising:
    forming a contact etching stop layer over the source/drain features, wherein the contact etching stop layer is in contact with the protection layer and the isolation structure; and
    forming an interlayer dielectric layer over the contact etching stop layer.

8. The method for forming the semiconductor structure as claimed in claim 1, further comprising:
    forming a contact etching stop layer over the source/drain features, the spacer layer and the sacrificial material; and
    forming an interlayer dielectric layer over the contact etching stop layer.

9. The method for forming the semiconductor structure as claimed in claim 1, wherein each of the active regions includes first semiconductor layers and second semiconductor layers alternatingly stacked, and after recessing the sacrificial material and before etching the spacer layer to expose the active regions, the sacrificial material has a top surface that is located between a top surface and a bottom of an uppermost one of the first semiconductor layer.

10. The method for forming the semiconductor structure as claimed in claim 9, further comprising:
    removing the dummy gate structures to form trenches;
    removing the first semiconductor layers to form gaps; and
    forming gate stacks to fill the trenches and gaps.

11. A method for forming a semiconductor structure, comprising:
    forming an active region over a substrate, the active region including a lower fin element and an epitaxial stack over the lower fin element;
    forming an isolation structure adjacent to the lower fin element;
    forming a spacer layer above the epitaxial stack and the isolation structure;

forming a sacrificial material on a first portion of the spacer layer directly above the isolation structure;
    removing a second portion of the spacer layer directly above the active region while the first portion of the spacer layer directly above the isolation structure remains unetched;
    patterning the epitaxial stack to form a set of nanostructures; and
    forming a gate stack to surround the set of nanostructures.

12. The method for forming the semiconductor structure as claimed in claim 11, wherein before removing the second portion of the spacer layer, a top surface of the sacrificial material is lower than a top surface of the epitaxial stack.

13. The method for forming the semiconductor structure as claimed in claim 11, further comprising:
    etching the active region to form a recess extending into the lower fin element, while the first portion of the spacer layer directly above the isolation structure remains unetched; and
    forming an epitaxial material in the recess.

14. The method for forming the semiconductor structure as claimed in claim 11, wherein the spacer layer includes a first dielectric material and a second dielectric material over the first dielectric material, wherein the first dielectric material and the second dielectric material are different materials.

15. The method for forming the semiconductor structure as claimed in claim 14, further comprising:
    removing the sacrificial material to expose the first portion of the spacer layer;
    removing the second dielectric material of the first portion of the spacer layer to expose the first dielectric material of the first portion of the spacer layer; and
    forming a contact etching stop layer on the spacer layer, wherein the contact etching stop layer is in contact with the first dielectric material and the second dielectric material.

16. A semiconductor structure, comprising:
    a first source/drain feature over a first fin element;
    an isolation structure surrounding the first fin element;
    a first fin spacer along a sidewall of the first source/drain feature;
    a protection layer along a top surface of the isolation structure; wherein the first fin spacer and the protection layer are made of a continuous dielectric material;
    a contact etching stop layer over the protection layer and the first fin spacer;
    a second source/drain feature over a second fin element; and
    a second fin spacer along a sidewall of the second source/drain feature, wherein a top surface of the protection layer extends from the first fin spacer to the second fin spacer.

17. The semiconductor structure as claimed in claim 16, wherein the contact etching stop layer is in contact with the protection layer, the first fin spacer and the first source/drain feature.

18. The semiconductor structure as claimed in claim 16, wherein a sidewall of the first fin spacer meets with a top surface of the protection layer at a round corner.

19. The semiconductor structure as claimed in claim 16, further comprising:
    a set of nanostructures over the first fin element and adjoining the first source/drain feature, wherein a top surface of the protection layer is lower than a top surface of a bottommost one of the nanostructures; and
    a gate stack wrapping around the set of nanostructures.

20. The semiconductor structure as claimed in claim 16, wherein there is no interface between the first fin spacer and the protection layer.

\* \* \* \* \*